(12) United States Patent
Liao et al.

(10) Patent No.: US 12,261,102 B2
(45) Date of Patent: Mar. 25, 2025

(54) SEMICONDUCTOR PACKAGE AND METHOD OF FORMING THE SAME

(71) Applicant: Taiwan Semiconductor Manufacturing Company, Ltd., Hsinchu (TW)

(72) Inventors: Li-Ling Liao, Hsinchu (TW); Ming-Chih Yew, Hsinchu (TW); Che-Chia Yang, Taipei (TW); Po-Chen Lai, Hsinchu County (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 625 days.

(21) Appl. No.: 17/461,941

(22) Filed: Aug. 30, 2021

(65) Prior Publication Data

US 2023/0063251 A1    Mar. 2, 2023

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4853* (2013.01); *H01L 21/4857* (2013.01);
(Continued)

(58) Field of Classification Search
CPC ............. H01L 21/4853; H01L 21/4857; H01L 21/563; H01L 21/568; H01L 21/6835;
(Continued)

(56) References Cited

U.S. PATENT DOCUMENTS 9,000,584 B2    4/2015   Lin et al.
9,048,222 B2    6/2015   Hung et al.
(Continued)

OTHER PUBLICATIONS

"Office Action of Taiwan Counterpart Application", issued on Jun. 16, 2022, pp. 1-5.

*Primary Examiner* — Telly D Green
(74) *Attorney, Agent, or Firm* — JCIPRNET

(57) ABSTRACT

A semiconductor package includes a redistribution structure, a first conductive pillar and a second conductive pillar, and a semiconductor device. The redistribution structure has a first surface and a second surface opposite to the first surface. The first conductive pillar and the second conductive pillar are disposed on the first surface of the redistribution structure and electrically connected with the redistribution structure, wherein a maximum lateral dimension of the first conductive pillar is greater than a maximum lateral dimension of the second conductive pillar, and a topography variation of a top surface of the first conductive pillar is greater than a topography variation of a top surface of the second conductive pillar. The semiconductor device is disposed over the first surface of the redistribution structure, wherein the semiconductor device comprises a third conductive pillar and a fourth conductive pillar, the third conductive pillar is bonded to first conductive pillar through a first joint structure, and the fourth conductive pillar is bonded to second conductive pillar through a second joint structure.

16 Claims, 13 Drawing Sheets

(51) Int. Cl.
*H01L 21/56* (2006.01)
*H01L 23/00* (2006.01)
*H01L 23/31* (2006.01)

(52) U.S. Cl.
CPC ........ *H01L 21/563* (2013.01); *H01L 23/3121* (2013.01); *H01L 23/49822* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 2224/13083* (2013.01); *H01L 2224/13147* (2013.01); *H01L 2224/13155* (2013.01); *H01L 2224/16238* (2013.01); *H01L 2224/32225* (2013.01); *H01L 2224/73204* (2013.01); *H01L 2224/8112* (2013.01)

(58) Field of Classification Search
CPC . H01L 2221/68327; H01L 2221/68345; H01L 2224/13083; H01L 2224/13147; H01L 2224/13155; H01L 2224/1403; H01L 2224/16225; H01L 2224/16238; H01L 2224/1703; H01L 2224/32225; H01L 2224/73204; H01L 2224/81001; H01L 2224/8112; H01L 2224/81193; H01L 2224/83001; H01L 23/3121; H01L 23/3128; H01L 23/49811; H01L 23/49816; H01L 23/49822; H01L 23/5383; H01L 24/05; H01L 24/13; H01L 24/16; H01L 24/32; H01L 24/73; H01L 24/81; H01L 24/83; H01L 2924/15311; H01L 2924/181; H01L 2924/18161; H01L 23/3107; H01L 23/49838; H01L 2924/00012

See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,960,137 | B1* | 5/2018 | Huang .................. H01L 24/05 |
| 10,163,798 | B1 | 12/2018 | Alur et al. |
| 11,139,260 | B2* | 10/2021 | Chang .................... H01L 24/32 |
| 11,527,505 | B2* | 12/2022 | Hacker ................ G06F 30/394 |
| 11,923,329 | B2* | 3/2024 | Hacker .................. H01L 24/17 |
| 2011/0024905 | A1* | 2/2011 | Lin ........................ H01L 24/17 |
| | | | 257/738 |
| 2011/0193220 | A1* | 8/2011 | Kuo ....................... H01L 24/11 |
| | | | 257/737 |
| 2015/0333026 | A1* | 11/2015 | Gandhi .................. H01L 24/13 |
| | | | 438/618 |
| 2017/0358545 | A1* | 12/2017 | Choi ...................... H01L 24/13 |
| 2019/0006289 | A1* | 1/2019 | Huang .................. H01L 24/02 |
| 2019/0385967 | A1* | 12/2019 | Hacker .................. H01L 24/11 |
| 2020/0350277 | A1* | 11/2020 | Lin ........................ H01L 24/14 |
| 2020/0365571 | A1* | 11/2020 | Chen .................... H01L 23/3128 |
| 2021/0074663 | A1* | 3/2021 | Hacker .................. H01L 24/13 |
| 2021/0082850 | A1* | 3/2021 | Chang ................... H01L 24/11 |
| 2021/0098406 | A1* | 4/2021 | Koduri .................. H01L 24/11 |
| 2021/0202336 | A1* | 7/2021 | Chang ................... H01L 24/32 |
| 2021/0366864 | A1* | 11/2021 | Fang ................... H01L 23/5384 |
| 2023/0104042 | A1* | 4/2023 | Hacker .................. H01L 24/14 |
| | | | 257/737 |
| 2023/0378065 | A1* | 11/2023 | Chu .................... H01L 23/5386 |

\* cited by examiner

SEMICONDUCTOR PACKAGE AND METHOD OF FORMING THE SAME

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. How to ensure the reliability of the integrated fan-out packages has become a challenge in the field.

DETAILED DESCRIPTION

Figure 1A:
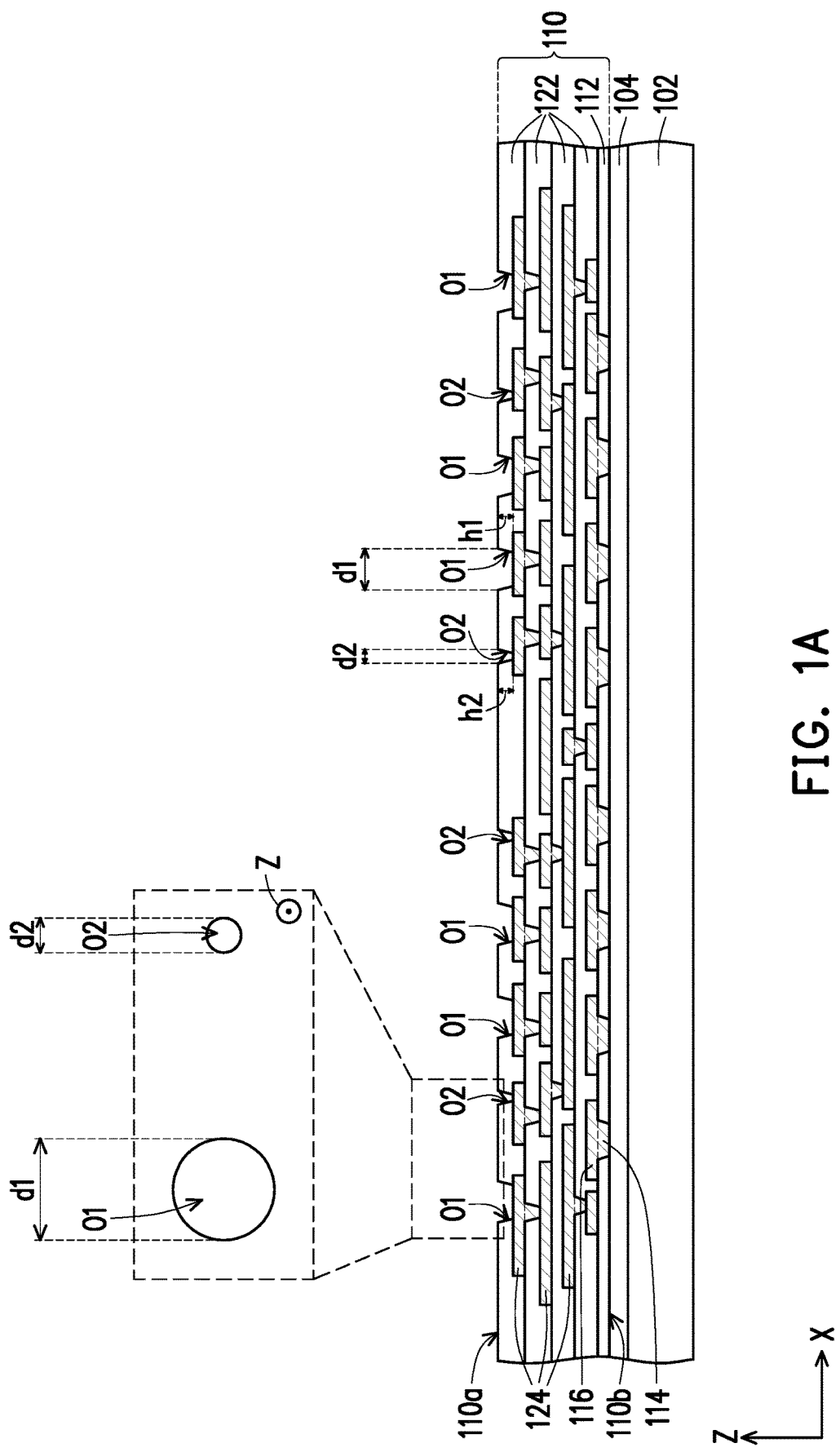
FIG. 1A to FIG. 1I are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
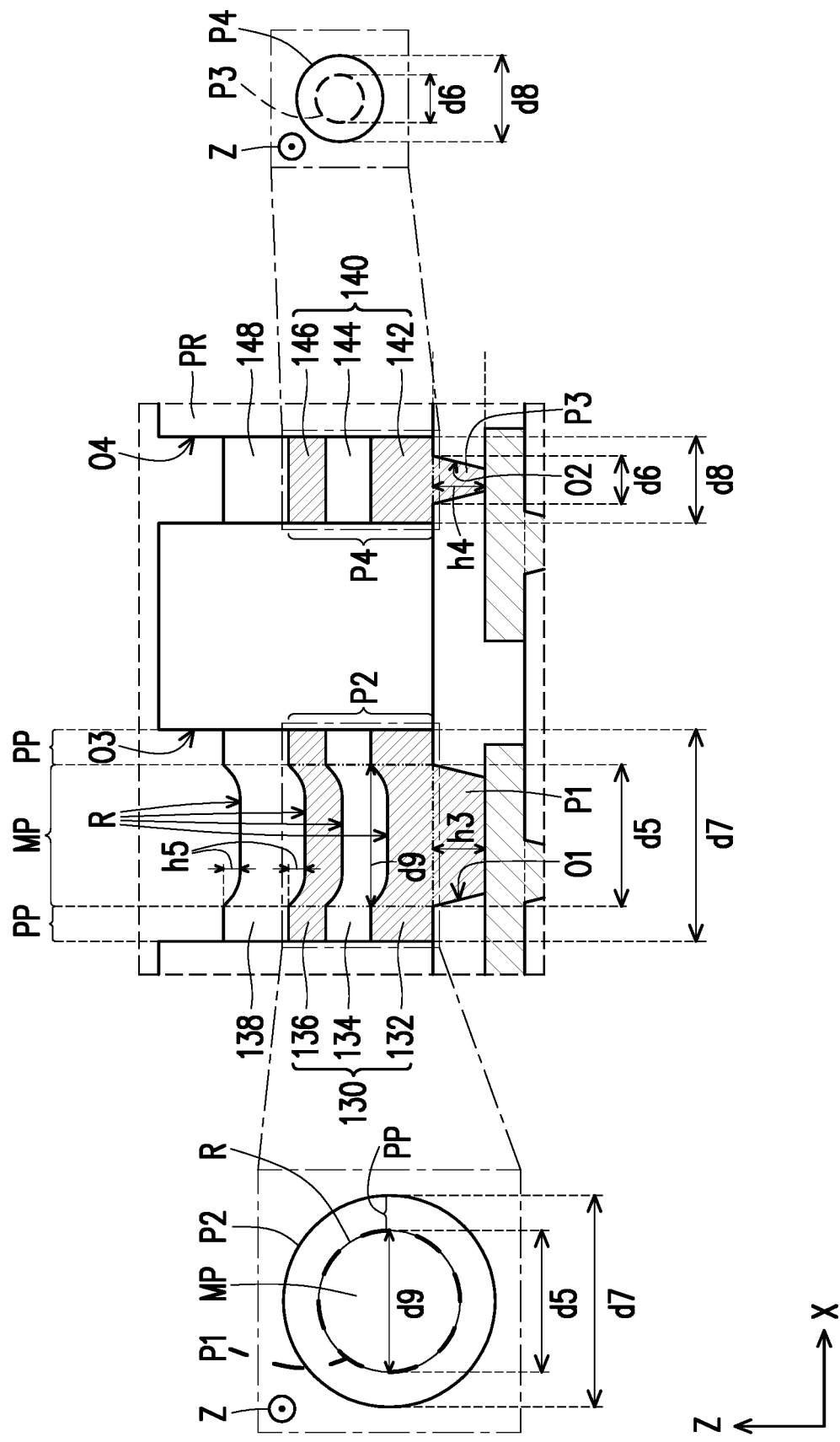
FIG. 2 is a schematic partial enlarge view of the dashed area A outlined in FIG. 1C.
Figure 3:
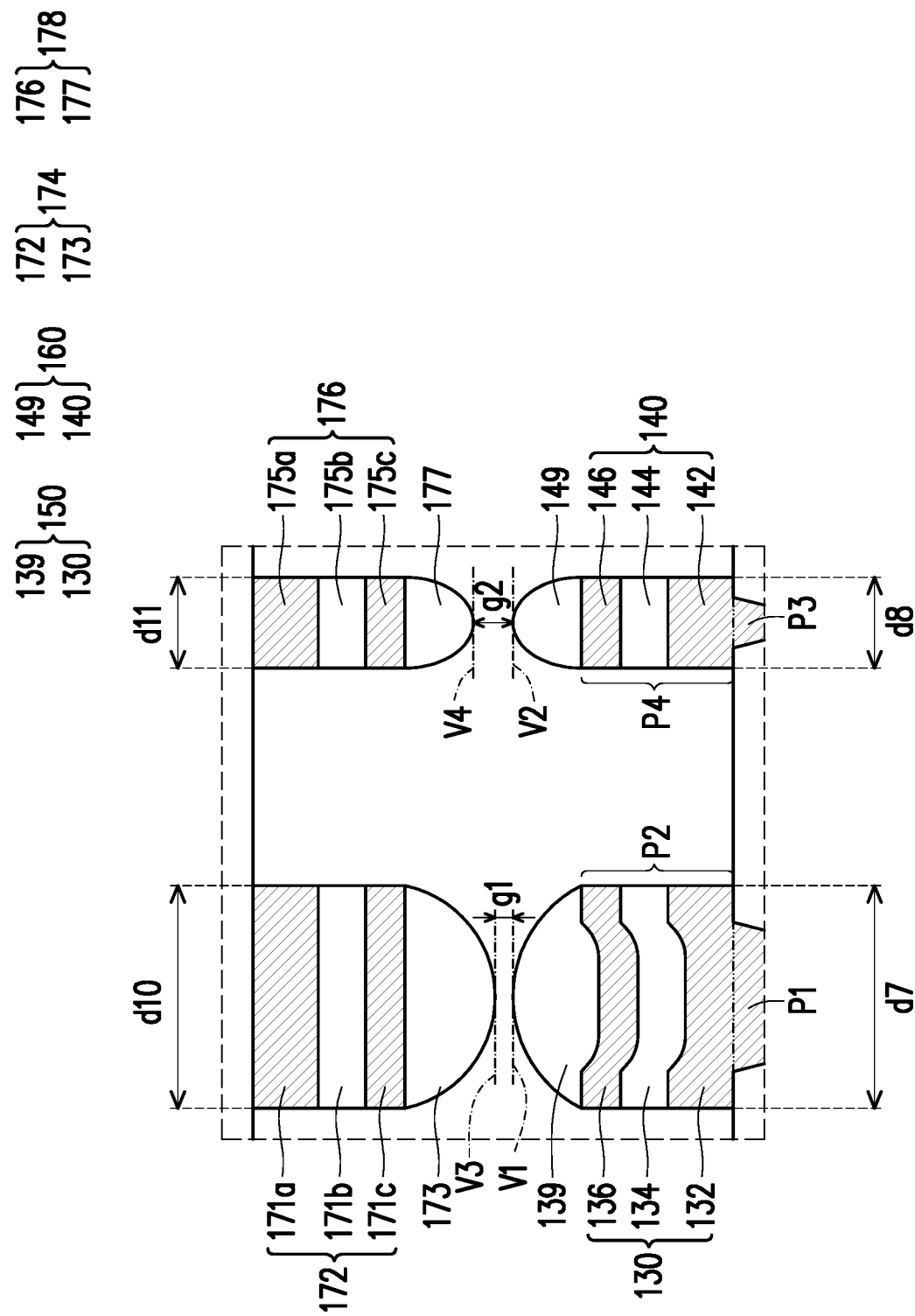
FIG. 3 is a schematic partial enlarge view of the dashed area B outlined in FIG. 1E.
Figure 4:
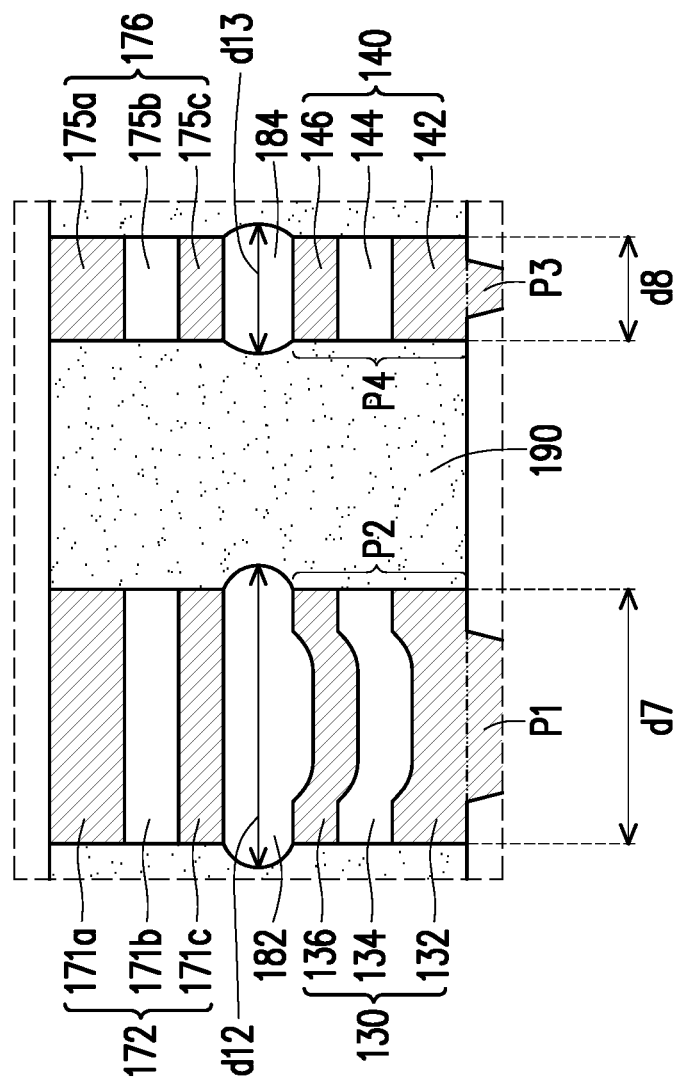
FIG. 4 is a schematic partial enlarge view of the dashed area C outlined in FIG. 1F.

FIG. 1A to FIG. 1I are schematic cross-sectional views illustrating a manufacturing process of a semiconductor package 100 in accordance with some embodiments of the disclosure. FIG. 2 is a schematic partial enlarge view of the dashed area A outlined in FIG. 1C. FIG. 3 is a schematic partial enlarge view of the dashed area B outlined in FIG. 1E. FIG. 4 is a schematic partial enlarge view of the dashed area C outlined in FIG. 1F. In exemplary embodiments, the following manufacturing process is part of a wafer level packaging process. In detail, one semiconductor package is shown to represent plural semiconductor packages obtained following the manufacturing process. That is to say, a single package region is illustrated in FIG. 1A to FIG. 1I, and the semiconductor package 100 (see FIG. 1I) is formed in the illustrated package region.

Referring to FIG. 1A, a carrier 102 having a de-bonding layer 104 thereon is provided. In some embodiments, the carrier 102 is a glass substrate. However, other material may be adapted as a material of the carrier 102 as long as the material is able to withstand the subsequent processes while carrying the package structure formed thereon. In some embodiments, the de-bonding layer 104 is formed on the illustrated top surface of the carrier 102, as shown in FIG. 1A. For example, the de-bonding layer 104 is a light-to-heat conversion (LTHC) release layer formed on the top surface of the glass substrate. However, the disclosure is not limited thereto, and other suitable materials may be adapted for the de-bonding layer 104. In detail, the de-bonding layer 104 may allow the structure formed on the carrier 102 in the subsequent processes to be peeled off from the carrier 102. In some alternative embodiments, a buffer layer (not shown) is coated on the de-bonding layer 104, where the de-bonding layer 104 is sandwiched between the buffer layer and the carrier 102, and a top surface of the buffer layer further provides a high degree of coplanarity. The buffer layer may be a dielectric material layer or a polymer layer which is made of polyimide, benzocyclobutene (BCB), polybenzoxazole (PBO), or any other suitable polymer-based dielectric material.

Then, a redistribution structure 110 is formed over the carrier 102 and the de-bonding layer 104. The redistribution structure 110 has a first surface 110a and a second surface 110b opposite to the first surface 110a. In some embodiments, the second surface 110b faces the carrier 102. In some embodiments, the second surface 110b is attached to the de-bonding layer 104.

In some embodiments, the formation of the redistribution structure 110 includes first forming a passivation layer 112 on the de-bonding layer 104. The material of the passivation layer 112 may include periodic mesoporous organosilica (PMO), low temperature polyimide (LTPI), polyimide derivative, PBO, or any other suitable dielectric material. The passivation layer 112 may be formed by spin-on coating, chemical vapor deposition (CVD), plasma-enhanced chemical vapor deposition (PECVD), or the like. The passivation layer 112 is a single layer or multiple layers. After forming the passivation layer 112, a plurality of conductive vias 114 are formed in the passivation layer 112, and a plurality of conductive patterns 116 are formed on the conductive vias 114 to electrically connect to the conductive vias 114 respectively. In some embodiments, a plurality of openings (not shown) are formed in the passivation layer 112, and the conductive vias 114 are formed in the openings. The conductive patterns 116 are then formed on the conductive vias 114 respectively. In some embodiments, the conductive vias 114 and the conductive patterns 116 are formed integrally by a dual damascene process. In some alternative embodiments, the conductive vias 114 and the conductive patterns 116 are formed separately by a single damascene process or any other suitable process. In some embodiments, as shown in FIG. 1A, the illustrated bottom surface of the passivation layer 112 and the illustrated bottom surfaces of the conductive vias 114 are collectively referred to as the second surface 110b of the redistribution structure 110. The conductive vias 114 and the conductive patterns 116 may each include a diffusion barrier layer and a conductive material thereon. The diffusion barrier layer may include one or more layers of TaN, Ta, TiN, Ti, CoW, or the like and be formed by atomic layer deposition (ALD), or the like, and the conductive material may include copper, aluminum, tungsten, silver, combinations thereof, or the like and be formed by CVD, physical vapor deposition (PVD), a plating process, or the like. The number of the conductive vias 114 and the number of the conductive patterns 116 are not limited in the disclosure, and may be more than or less than what is depicted in FIG. 1A, and may be designated based on demand and/or design layout.

After forming the conductive patterns 116, a plurality of dielectric layers 122 and a plurality of conductive layers 124 are alternately formed over the conductive patterns 116, to complete the formation of the redistribution structure 110. In some embodiments, as shown in FIG. 1A, the dielectric layers 122 and the conductive layers 124 are sequentially formed in alternation along a direction Z parallel with a normal direction of the carrier 102. In detail, as shown in FIG. 1A, the conductive layers 124 are sandwiched between the dielectric layers 122, but the illustrated top surface of the topmost layer of the conductive layers 124 is exposed by the topmost layer of the dielectric layers 122, and the bottommost layer of the conductive layers 124 is exposed by the bottommost layer of the dielectric layers 122. It should be noted that although three conductive layers 124 and four dielectric layers 122 are illustrated in FIG. 1A, the number of these layers is not limited in this disclosure. In some alternative embodiments, the redistribution structure 110 may be constituted by more or less layers of the conductive layer 124 and the dielectric layer 122 depending on the circuit design.

In some embodiments, the material of the dielectric layer 122 includes polyimide, epoxy resin, acrylic resin, phenol resin, BCB, PBO, or any other suitable polymer-based dielectric material. The dielectric layer 122 may be formed by suitable fabrication techniques such as spin-on coating, CVD, PECVD or the like. In some embodiments, the material of the conductive layer 124 includes aluminum, titanium, copper, nickel, tungsten, and/or alloys thereof. The conductive layers 124 may include a diffusion barrier layer and a conductive material thereon. The diffusion barrier layer may include one or more layers of TaN, Ta, TiN, Ti, CoW, or the like and be formed by ALD, or the like, and the conductive material may include copper, aluminum, tungsten, silver, combinations thereof, or the like and be formed by CVD, PVD, a plating process, or the like. The conductive layers 124 may include vias and/or traces. The conductive layers 124 may be formed in/on the dielectric layers 122. The conductive layer 124 may be formed by, for example, electroplating, deposition, and/or photolithography and etching.

In some embodiments, as shown in FIG. 1A, the topmost layer of the dielectric layers 122 includes a plurality of openings O1 and a plurality of openings O2. In detail, as shown in FIG. 1A, each of the openings O1 and the openings O2 penetrates through the topmost layer of the dielectric layers 122 to expose a portion of the illustrated top surface of the topmost layer of the conductive layers 124. That is to say, the topmost layer of the conductive layers 124 is exposed through the openings O1 and the openings O2. In some embodiments, the openings O1 and the openings O2 are formed by photolithography, etching, and photoresist stripping processes. As shown in FIG. 1A, although six openings O1 and four openings O2 are presented in the topmost layer of the dielectric layers 122 for illustrative purposes, those skilled in the art can understand that the number of the openings O1 and the number of the openings O2 may be more than or less than what is depicted in FIG. 1A, and may be designated based on demand and/or design layout.

In some embodiments, the opening O1 is formed with the depth h1, and the opening O2 is formed with the depth h2. As shown in FIG. 1A, the depth h1 is substantially the same as the depth h2. However, the disclosure is not limited thereto. In some alternative embodiments, the depth h1 may be different from the depth h2. In some embodiments, the depth h1 and the depth h2 each ranges from about 2 μm to about 10 μm. In some embodiments, as shown in FIG. 1A, the maximum dimension d1 of the opening O1 along a direction X perpendicular to the direction Z is greater than the maximum dimension d2 of the opening O2 along the direction X. That is to say, the lateral size of the opening O1 is greater than the lateral size of the opening O2. In some embodiments, the maximum dimension d1 of the opening O1 ranges from about 15 μm to about 85 μm, and the maximum dimension d2 of the opening O2 ranges from about 4.5 μm to about 24 μm. From another point of view, as shown in FIG. 1A, the maximum dimension d1 of the opening O1 is the topmost lateral dimension of the opening O1, and the maximum dimension d2 of the opening O2 is the topmost lateral dimension of the opening O2. That is to say, the openings O1 and the openings O2 are formed to become tapering with slanted sidewalls.

As shown in a schematic enlarged top view of FIG. 1A, the opening O1 and the opening O2 each is formed to have a circular shape. However, the disclosure is not limited thereto. In some alternative embodiments, the opening O1 and the opening O2 each may exhibit a polygonal shape, an oval shape or any suitable shape from the top view. In the case that the opening O1 and the opening O2 each has a circular top-view shape (as shown in FIG. 1A), then the maximum dimension d1 and maximum dimension d2 each may be the diameter.

Figure 1B:
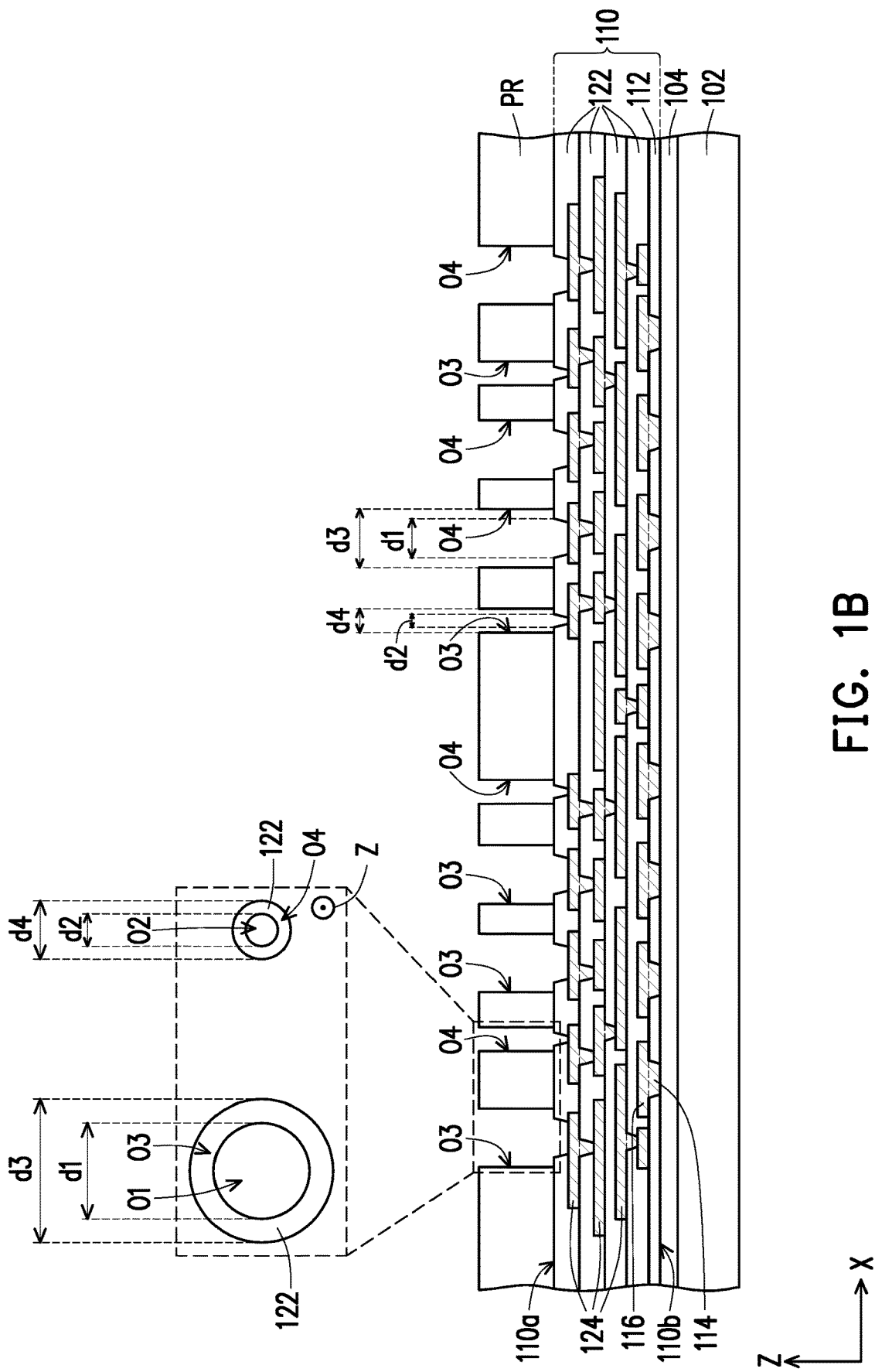

Referring to FIG. 1B, a patterned mask layer PR including a plurality of openings O3 and a plurality of openings O4 is formed on the first surface 110a of the redistribution structure 110. In detail, as shown in FIG. 1B, each of the openings O3 is formed to be in communication with one of the openings O1 of the topmost layer of the dielectric layers 122 in a one-to-one relationship, and each of the openings O4 is formed to be in communication with one of the openings O2 of the topmost layer of the dielectric layers 122 in a one-to-one relationship. That is to say, each opening O3 and the corresponding opening O1 collectively expose a portion of the illustrated top surface of the topmost layer of the conductive layers 124, and each opening O4 and the corresponding opening O2 collectively expose a portion of the illustrated top surface of the topmost layer of the conductive layers 124. In other words, the openings O3 are located above the openings O1, and the openings O4 are located above the openings O2. It is noted that the number of the openings O3 is corresponding to the number of the openings O1, and the number of the openings O4 is corresponding to the number of the openings O2. The patterned mask layer PR may define the lateral boundaries of the conductive bumps to be subsequently formed. That is to say, the openings O3 and the openings O4 are formed in the patterned mask layer PR for bump formation. The patterned mask layer PR may be a dry film or a photoresist film used through the steps of coating, curing and/or the like, followed by lithography techniques and/or etching processes such as a dry etching and/or a wet etching process.

In some embodiments, as shown in FIG. 1B, the maximum dimension d3 of the opening O3 along the direction X is greater than the maximum dimension d4 of the opening O4 along the direction X. That is to say, the lateral size of the opening O3 is greater than the lateral size of the opening O4. In some embodiments, the maximum dimension d3 of the opening O3 ranges from about 50 μm to about 100 μm, and the maximum dimension d4 of the opening O4 ranges from about 15 μm to about 40 μm. In some embodiments, the difference between the maximum dimension d3 of the opening O3 and the maximum dimension d4 of the opening O4 is greater than or substantially equal to about 10 μm. As shown in a schematic enlarged top view of FIG. 1B, the opening O3 and the opening O4 each is formed to have a circular shape. However, the disclosure is not limited thereto. In some alternative embodiments, the opening O3 and the opening O4 each may exhibit a polygonal shape, an oval shape or any suitable shape from the top view. In the case that the opening O3 and the opening O4 each has a circular top-view shape (as shown in FIG. 1B), then the maximum dimension d3 and maximum dimension d4 each may be the diameter.

In some embodiments, the maximum dimension d1 of the opening O1 is less than the maximum dimension d3 of the opening O3, and the maximum dimension d2 of the opening O2 is less than the maximum dimension d4 of the opening O4. That is to say, the lateral span of the opening O3 is greater than the lateral span of the opening O1, and the lateral span of the opening O4 is greater than the lateral span of the opening O2. In other words, a portion of the illustrated top surface of the topmost layer of the dielectric layers 122 near to the opening O1 is exposed by the opening O3, and a portion of the illustrated top surface of the topmost layer of the dielectric layers 122 near to the opening O2 is exposed by the opening O4. Further, as shown in the schematic enlarged top view of FIG. 1B, along the direction Z, the vertical projection of the opening O1 falls totally within the span of the vertical projection of the corresponding opening O3, and the vertical projection of the opening O2 falls totally within the span of the vertical projection of the corresponding opening O4. That is to say, the whole vertical projection of the opening O1 overlaps the vertical projection of the corresponding opening O3, and the whole vertical projection of the opening O2 overlaps the vertical projection of the corresponding opening O4. From another point of view, as shown in the schematic enlarged top view of FIG. 1B, the opening O3 is substantially concentric with the opening O1. That is to say, the opening O1 is located at the center of the opening O3. However, the disclosure is not limited thereto.

In some alternative embodiments, the opening O1 may be located near the center of the opening O3 or even shifted aside but not beyond the span of the opening O3 (similar to eccentric circles from the top view). Similarly, from the top view, the opening O2 may be located at a center of the opening O4 (similar to concentric circles, as seen in the enlarged top view of FIG. 1B); or the opening O2 may be located near the center of the opening O4 or even shifted aside but not beyond the span of the opening O4 (similar to eccentric circles). In some embodiments, a ratio of the maximum dimension d1 of the opening O1 to the maximum dimension d3 of the opening O3 (i.e., a diameter ratio (size ratio) of the opening O1 and the opening O3) is about 0.4 to about 0.95. In other embodiments, a ratio of the maximum dimension d1 of the opening O1 to the maximum dimension d3 of the opening O3 (i.e., a diameter ratio (size ratio) of the opening O1 and the opening O3) is about 0.3 to about 0.85. In some embodiments, a ratio of the maximum dimension d2 of the opening O2 to the maximum dimension d4 of the opening O4 (i.e., a diameter ratio (size ratio) of the opening O2 and the opening O4) is about 0.3 to about 0.6. In some embodiments, the difference between the maximum dimension d1 of the opening O1 and the maximum dimension d3 of the opening O3 is greater than about 2 μm.

Figure 1C:
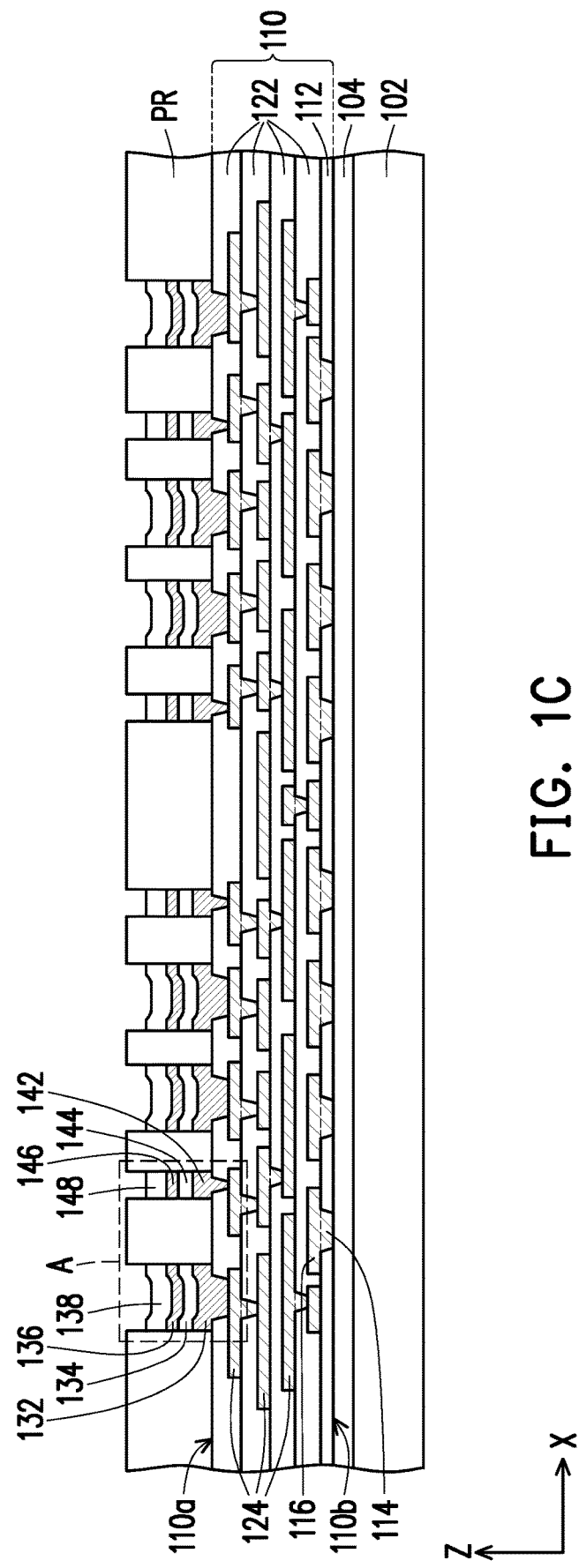

Referring to FIG. 1C and FIG. 2, each of the openings O3 and the openings O4 of the patterned mask layer PR is filled with layers of conductive materials. In detail, as shown in FIG. 1C and FIG. 2, the layers of conductive materials filled in the opening O3 includes a first conductive layer 132, a second conductive layer 134, a third conductive layer 136, and a fourth conductive layer 138, and the layers of conductive materials filled in the opening O4 includes a first conductive layer 142, a second conductive layer 144, a third conductive layer 146, and a fourth conductive layer 148. The formation method of the layers of conductive materials in each of the openings O3 and the openings O4 may include plating, sputtering, printing, electrochemical deposition, ALD, CVD, and/or other suitable methods. In some embodiments, the layers of conductive materials in each of the openings O3 and the openings O4 are sequentially plated on the topmost layer of the conductive layers 124. In some embodiments, the multi-step plating process including two or more than two plating steps is used for forming the layers of conductive materials in each of the openings O3 and the openings O4. In some embodiments, the layers of conductive materials in each of the openings O3 and the layers of conductive materials in each of the openings O4 are formed in the same process (e.g., plating process). In some alternative embodiments, the layers of conductive materials in each of the openings O3 and the layers of conductive materials in each of the openings O4 are formed in separate and independent processes.

In some embodiments, the first conductive layers 132 and the first conductive layers 142 are initially formed on the portions of the topmost layer of the conductive layers 124 exposed by the topmost layer of the dielectric layers 122 and the patterned mask layer PR. In detail, as shown in FIG. 1C and FIG. 2, each of the first conductive layers 132 is formed in the corresponding opening O3 and is connected with the topmost layer of the conductive layers 124 through the corresponding opening O1, and each of the first conductive layers 142 is formed in the corresponding opening O4 and is connected with the topmost layer of the conductive layers 124 through the corresponding opening O2. From another point of view, as shown in FIG. 1C and FIG. 2, a portion of the first conductive layer 132 is in contact with the illustrated top surface of the topmost layer of the dielectric layers 122 exposed by the opening O3, and another portion of the first conductive layer 132 fills up the opening O1; and a portion of the first conductive layer 142 is in contact with the illustrated top surface of the topmost layer of the dielectric layers 122 exposed by the opening O4, and another portion of the first conductive layer 142 fills up the opening O2. In some embodiments, the first conductive layers 132, 142 are copper-containing layers. The first conductive layer 132 and the first conductive layer 142 may include pure elemental copper, copper containing impurities, and/or copper alloys containing minor amounts of elements such as indium, titanium, tantalum, chromium, tin, zinc, manganese, germanium, platinum, magnesium, aluminum, etc.

Next, the second conductive layers 134 and the second conductive layers 144 are respectively formed on the first conductive layers 132 and the first conductive layers 142. In detail, as shown in FIG. 1C and FIG. 2, each of the second conductive layers 134 is formed in the corresponding opening O3, and each of the second conductive layers 144 is formed in the corresponding opening O4. In some embodiments, the second conductive layers 124, 144 are of different materials from the first conductive layers 132, 142. For example, the second conductive layers 134, 144 are nickel-containing layers. The second conductive layer 134 and the second conductive layer 144 may include nickel, tin, tin-lead, gold, silver, platinum, palladium, Indium, nickel-palladium-gold, nickel-gold, other similar materials, or alloys.

Next, as shown in FIG. 1C and FIG. 2, the third conductive layers 136 and the third conductive layers 146 are respectively formed on the second conductive layers 134 and the second conductive layers 144. In detail, each of the third conductive layers 136 is formed in the corresponding opening O3 and on the corresponding second conductive layer 134, and each of the third conductive layers 146 is formed in the corresponding opening O4 and on the corresponding second conductive layer 144. However, the disclosure is not limited thereto. In some alternative embodiments, the third conductive layers 136, 146 are omitted. The third conductive layers 136, 146 may include the same/similar conductive material(s) as the first conductive layers 132, 142. For example, the first conductive layers 132, 142 and the third conductive layers 136, 146 are copper-containing layer, and the second conductive layers 134, 144 interposed therebetween may serve as barrier layers. The third conductive layer 136 and the third conductive layer 146 may include pure elemental copper, copper containing impurities, and/or copper alloys containing minor amounts of elements such as indium, titanium, tantalum, chromium, tin, zinc, manganese, germanium, platinum, magnesium, aluminum, etc.

Subsequently, as shown in FIG. 1C and FIG. 2, the fourth conductive layers 138 and the fourth conductive layers 148 are respectively formed on the third conductive layers 136 and the third conductive layers 146. In detail, each of the fourth conductive layers 138 is formed in the corresponding opening O3 and on the corresponding third conductive layer 136, and each of the fourth conductive layers 148 is formed in the corresponding opening O4 and on the corresponding third conductive layer 146. However, the disclosure is not limited thereto. In embodiments where the third conductive layers 136, 146 are omitted, each of the fourth conductive layers 138 is formed on and in contact with the corresponding second conductive layer 134, and each of the fourth conductive layers 148 is formed on and in contact with the corresponding second conductive layer 134. Due to the different sizes of the opening O3 and the opening O4, the volume of the fourth conductive layer 138 formed in the opening O3 is different from the volume of the fourth conductive layer 148 formed in the opening O4. In some embodiments, the volume of the fourth conductive layer 138 is greater than the volume of the fourth conductive layer 148. In some embodiments, the material of the fourth conductive layers 138, 148 is different from the underlying conductive layers (e.g., first conductive layers 132-142, second conductive layers 134-144, and/or third conductive layers 136-146). For example, the fourth conductive layers 138, 148 are a solder-containing layer. The fourth conductive layer 138 and the fourth conductive layer 148 may include lead-free solder, such as tin, SnAg, tin bismuth (SnBi) solder, tin-silver-copper (SAC) solder, and/or combinations thereof, or the like.

In some embodiments, the first conductive layer 132, the second conductive layer 134 and the third conductive layer 136 sequentially formed in each openings O1 and the corresponding opening O3 along the direction Z are collectively referred to as a conductive pillar 130, and the first conductive layer 142, the second conductive layer 144 and the third conductive layer 146 sequentially formed in each opening O2 and the corresponding opening O4 along the direction Z are collectively referred to as a conductive pillar 140. That is to say, the number of the conductive pillars 130 is corresponding to the number of the openings O1, and the number of the conductive pillars 140 is corresponding to the number of the openings O2. In some embodiments, as shown in FIG. 1C and FIG. 2, the fourth conductive layers 138 are formed on the illustrated top surfaces of the conductive pillars 130, and the fourth conductive layers 148 are formed on the illustrated top surfaces of the conductive pillars 140. In some embodiments, as shown in FIG. 1C and FIG. 2, the conductive pillars 130 and the conductive pillars 140 are formed to be electrically connected with the redistribution structure 110.

In some embodiments, as shown in FIG. 1C and FIG. 2, the conductive pillar 130 is divided into a via portion P1 filled in the opening O1 of the topmost layer of the dielectric layers 122 and a pillar portion P2 over the via portion P1 and filled in the opening O3 of the patterned mask layer PR. That is to say, the conductive pillar 130 may be regarded as having two portions, one of the two portions is embedded in the topmost layer of the dielectric layers 122, and another one of the two portions extends on the illustrated top surface of the topmost layer of the dielectric layers 122. From another point of view, as shown in FIG. 1C and FIG. 2, since the first conductive layer 132 formed in the opening O3 is in contact with the topmost layer of the conductive layers 124 through filling up the opening O1, a portion of the first conductive layer 132 within the opening O1 is formed as the via portion P1, and the rest portion of the first conductive layer 132 within the opening O3, the second conductive layer 134 and the third conductive layer 136 are collectively formed as the conductive pillar 130.

Similarly, as shown in FIG. 1C and FIG. 2, the conductive pillar 140 is divided into a via portion P3 filled in the opening O2 of the topmost layer of the dielectric layers 122 and a pillar portion P4 over the via portion P3 and filled in the opening O4 of the patterned mask layer PR. That is to say, the conductive pillar 140 may be regarded as having two portions, one of the two portions is embedded in the topmost layer of the dielectric layers 122, and another one of the two portions extends on the illustrated top surface of the topmost layer of the dielectric layers 122. From another point of view, as shown in FIG. 1C and FIG. 2, since the first conductive layer 142 formed in the opening O4 is in contact with the topmost layer of the conductive layers 124 through filling up the opening O2, a portion of the first conductive layer 142 within the opening O2 is formed as the via portion P2, and the rest portion of the first conductive layer 142 within the opening O4, the second conductive layer 144 and the third conductive layer 146 are collectively formed as the conductive pillar 140.

Since the via portions P1 and the via portions P3 are respectively formed within and filling up the openings O1 and the openings O2 of the topmost layer of the dielectric layers 122, the maximum dimension d5 of the via portions P1 substantially follows the maximum dimension d1 of the openings O1, the height h3 of the via portions P1 substantially follows the depth h1 of the openings O1, the maximum dimension d6 of the via portions P3 substantially follows the maximum dimension d2 of the openings O2, and the height h4 of the via portions P3 substantially follows the depth h2 of the openings O2. From another point of view, the shape of via portions P1 is substantially identical to the shape of the openings O1, and the shape of the via portions P3 is substantially identical to the shape of the openings O2.

In detail, the lateral size of the via portion P1 is greater than the lateral size of the via portion P3. In some embodiments, the maximum dimension d5 of the via portion P1 ranges from about 15 μm to about 85 μm, and the maximum dimension d6 of the via portion P3 ranges from about 4.5 μm to about 24 μm. From another point of view, as shown in FIG. 2, the maximum dimension d5 of the via portion P1 is the topmost lateral dimension of the via portion P1, and the maximum dimension d6 of the via portion P3 is the topmost lateral dimension of the via portion P3. That is to say, the via portion P1 and the via portion P3 are formed with the cross-sectional shapes of inverted trapezoid. In some embodiments, the height h3 of the via portions P1 is substantially the same as the height h4 of the via portions P3. In some alternative embodiments, the height h3 of the via portions P1 may be different from the height h4 of the via portions P3. In some embodiments, the height h3 and the height h4 each ranges from about 2 μm to about 10 μm. In some embodiments, as shown in a schematic enlarged top view of FIG. 2, the via portion P1 and the via portion P3 each is formed to have a circular shape. In some alternative embodiments, the via portion P1 and the via portion P3 each may exhibit a polygonal shape, an oval shape or any suitable shape from the top view. In the case that the via portion P1 and the via portion P3 each has a circular top-view shape (as shown in FIG. 2), then the maximum dimension d5 and maximum dimension d6 each may be the diameter.

Further, since the pillar portions P2 and the pillar portions P4 are respectively formed within the openings O3 and the openings O4 of the patterned mask layer PR, the maximum dimension d7 of the pillar portions P2 substantially follows the maximum dimension d3 of the openings O3, and the maximum dimension d8 of the pillar portions P4 substantially follows the maximum dimension d4 of the openings O4. From another point of view, the shape of pillar portions P2 is substantially identical to the shape of the openings O3, and the shape of the pillar portions P4 is substantially identical to the shape of the openings O4.

In detail, the lateral size of the pillar portion P2 is greater than the lateral size of the pillar portion P4. In some embodiments, the maximum dimension d7 of the pillar portion P2 ranges from about 50 μm to about 100 μm, and the maximum dimension d8 of the pillar portion P4 ranges from about 15 μm to about 40 μm. In some embodiments, the difference between the maximum dimension d7 of the pillar portion P2 and the maximum dimension d8 of the pillar portion P4 is greater than or substantially equal to about 10 μm. In some embodiments, as shown in a schematic enlarged top view of FIG. 2, the pillar portion P2 and the pillar portion P4 each is formed to have a circular shape. However, the disclosure is not limited thereto. In some alternative embodiments, the pillar portion P2 and the pillar portion P4 each may exhibit a polygonal shape, an oval shape or any suitable shape from the top view. In the case that the pillar portion P2 and the pillar portion P4 each has a circular top-view shape (as shown in FIG. 2), then the maximum dimension d7 and maximum dimension d8 each may be the diameter.

In some embodiments, the maximum dimension d5 of the via portion P1 is less than the maximum dimension d7 of the pillar portion P2, and the maximum dimension d6 of the via portion P3 is less than the maximum dimension d8 of the pillar portion P4. That is to say, the lateral span of the pillar portion P2 is greater than the lateral span of the via portion P1, and the lateral span of the pillar portion P4 is greater than the lateral span of the via portion P3. Further, as shown in the schematic enlarged top view of FIG. 2, along the direction Z, the vertical projection of the via portion P1 falls totally within the span of the vertical projection of the corresponding pillar portion P2, and the vertical projection of the via portion P3 falls totally within the span of the vertical projection of the corresponding pillar portion P4. That is to say, the whole vertical projection of the via portion P1 overlaps the vertical projection of the corresponding pillar portion P2, and the whole vertical projection of the via portion P3 overlaps the vertical projection of the corresponding pillar portion P4. From another point of view, as shown in the schematic enlarged top view of FIG. 2, the pillar portion P2 is substantially concentric with the via portion P1. That is to say, the via portion P1 is located at the center of the pillar portion P2. However, the disclosure is not limited thereto. In some alternative embodiments, the via portion P1 may be located near the center of the pillar portion P2 or even shifted aside but not beyond the span of the pillar portion P2 (similar to eccentric circles from the top view). Similarly, from the top view, the via portion P3 may be located at a center of the pillar portion P4 (similar to concentric circles, as seen in the enlarged top view of FIG. 2); or the via portion P3 may be located near the center of the pillar portion P4 or even shifted aside but not beyond the span of the pillar portion P4 (similar to eccentric circles). In some embodiments, a ratio of the maximum dimension d5 of the via portion P1 to the maximum dimension d7 of the pillar portion P2 (i.e., a diameter ratio (size ratio) of the via portion P1 and the pillar portion P2) is about 0.4 to about 0.95. In other embodiments, a ratio of the maximum dimension d5 of the via portion P1 to the maximum dimension d7 of the pillar portion P2 (i.e., a diameter ratio (size ratio) of the via portion P1 and the pillar portion P2) is about 0.3 to about 0.85. In some embodiments, a ratio of the maximum dimension d6 of the via portion P3 to the maximum dimension d8 of the pillar portion P4 (i.e., a diameter ratio (size ratio) of the via portion P3 and the pillar portion P4) is about 0.3 to about 0.6. In some embodiments, the difference between the maximum dimension d5 of the via portion P1 to the maximum dimension d7 of the pillar portion P2 is greater than about 2 μm.

The conductive pillars 130 may each be formed with the maximum dimension d5, the height h3, the maximum dimension d7, and/or a particular size ratio between the maximum dimension d5 and the maximum dimension d7, and the conductive pillars 140 may each be formed with the maximum dimension d6, the height h4, the maximum dimension d8, and/or a particular size ratio between the maximum dimension d6 and the maximum dimension d8, such that the topography variation of the illustrated top surface of each conductive pillar 130 is greater than the topography variation of the illustrated top surface of each conductive pillar 140. Here, the topography variation is referred as a height difference between a highest point and a lowest point of the illustrated top surface of the conductive pillar 130 or the conductive pillar 140. In some embodiments, as shown in FIG. 1C and FIG. 2, the illustrated top surface of each of the first conductive layer 132, the second conductive layer 134 and the third conductive layer 136 has a recess R. That is to say, after the layers of conductive materials are formed in the openings O3 and the openings O1, the recesses R may be formed on the illustrated top surfaces of the conductive pillars 130. In other words, the illustrated top surface of each of the conductive pillars 130 is an uneven surface.

In some embodiments, the maximum depth h5 of the recess R is less than or equal to the height h3 of the via portion P1. In some embodiments, the maximum depth h5 of the recess R ranges from greater than 0 μm to less than or equal to about 10 μm. That is to say, the topography variation of the illustrated top surface of each of the first conductive layer 132, the second conductive layer 134 and the third conductive layer 136 ranges from greater than 0 μm to less than about 10 μm. From another point of view, as shown in FIG. 1C and FIG. 2, the illustrated top surface of each of the first conductive layer 132, the second conductive layer 134 and the third conductive layer 136 has a curved surface, and the depth of the recess R increases from the edge of the recess R to the center of the recess R. In some embodiments, the maximum dimension d9 of the recess R along the direction X is less than or equal to the maximum dimension d5 of the via portion P1. In some embodiments, the maximum dimension d9 of the recess R ranges from about 10 μm to about 85 μm. In some embodiments, as shown in FIG. 1C and FIG. 2, the depths h5 of the recesses R of the first conductive layer 132, the second conductive layer 134 and the third conductive layer 136 are the same as each other, and the maximum dimensions d9 of the recesses R of the first conductive layer 132, the second conductive layer 134 and the third conductive layer 136 are the same as each other. However, the disclosure is not limited thereto. In some alternative embodiments, the depths h5 of the recesses R in the conductive pillar 130 are decreased from bottom to top, and the maximum dimensions d9 of the recesses R in the conductive pillar 130 are decreased from bottom to top. That is to say, in such embodiments, the maximum depth h5 of the recess R of the third conductive layer 136 is less than the maximum depth h5 of the recess R of the second conductive layer 134, the maximum depth h5 of the recess R of the second conductive layer 134 is less than the maximum depth h5 of the recess R of the first conductive layer 132, the maximum dimension d9 of the recess R of the third conductive layer 136 is less than the maximum dimension d9 of the recess R of the second conductive layer 134, and the maximum dimension d9 of the recess R of the second conductive layer 134 is less than the maximum dimension d9 of the recess R of the first conductive layer 132.

In some embodiments, as shown in FIG. 1C and FIG. 2, the recess R of the conductive pillar 130 on the top surface thereof (i.e., the recess R of the third conductive layer 136) is able to accommodate a portion of the fourth conductive layer 138 formed thereon. In other words, a portion of the fourth conductive layer 138 sags due to the recess R of the conductive pillar 130. As such, the conductive vias 162A also include the recess R on the illustrated top surface thereof, as shown in FIG. 1C and FIG. 2. In some embodiments, as shown in FIG. 1C and FIG. 2, the maximum depth h5 of the recess R of the fourth conductive layer 138 is the same as the maximum depth h5 of each recess R in the conductive pillar 130, and the maximum dimension d9 of the recess R of the fourth conductive layer 138 is the same as the maximum dimension d9 of each recess R in the conductive pillar 130. However, the disclosure is not limited thereto. In embodiments where the depths h5 and the maximum dimensions d9 of the recesses R in the conductive pillar 130 are decreased from bottom to top, the maximum depth h5 of the recess R of the fourth conductive layer 138 is less than the maximum depth h5 of the recess R of the third conductive layer 136, and the maximum dimension d9 of the recess R of the fourth conductive layer 138 is less than the maximum dimension d9 of the recess R of the third conductive layer 136.

In some embodiments, as shown in the schematic enlarged top view of FIG. 2, along the direction Z, the vertical projection of the recess R of the conductive pillar 130 on the top surface thereof and the vertical projection of the via portion P1 completely overlap with each other. That is to say, the span of the vertical projection of the recess R of the conductive pillar 130 is the same as the span of the vertical projection of the via portion P1. However, the disclosure is not limited thereto. In embodiments where the maximum dimensions d9 of the recesses R in the conductive pillar 130 are decreased from bottom to top, the vertical projection of the recess R of the conductive pillar 130 on the top surface thereof may fall within the span of the vertical projection of the via portion P1. Further, in some embodiments, as shown in the schematic enlarged top view of FIG. 2, the recess R is formed to have a circular shape. However, the disclosure is not limited thereto. In some alternative embodiments, the recess R may exhibit a polygonal shape, an oval shape or any suitable shape from the top view. In the case that the recess R has a circular top-view shape (as shown in FIG. 2), then the maximum dimension d9 may be the diameter. From another point of view, as shown in the schematic enlarged top view of FIG. 2, in the conductive pillar 130, the pillar portion P2 is substantially concentric with the recess R. That is to say, the recess R is located at the center of the top surface of the pillar portion P2. However, the disclosure is not limited thereto. In some alternative embodiments, the recess R may be located near the center of the top surface of the pillar portion P2 or even shifted aside but not beyond the span of the top surface of the pillar portion P2 (similar to eccentric circles from the top view).

In some embodiments, as shown in FIG. 1C and FIG. 2, each of the conductive pillars 130 includes a main body portion MP and a peripheral portion PP wrapping the main body portion MP. In detail, as shown in FIG. 1C and FIG. 2, the main body portion MP is disposed in the opening O1 and protrudes from the illustrated top surface of the topmost layer of the dielectric layers 122. That is to say, the main body portion MP includes the via portion P1 and a portion of the pillar portion P2 located right above the via portion P1 along the direction Z. In other words, the main body portion MP is divided into two portions, one of the two portions is embedded in the redistribution structure 110, and another one of the two portions protrudes from the redistribution structure 110. And, as shown in FIG. 1C and FIG. 2, the peripheral portion PP is connected with the upper side surface of the main body portion MP and the illustrated top surface of the topmost layer of the dielectric layers 122. That is to say, the main body portion MP includes the rest portion of the pillar portion P2 being not overlapped with the via portion P1 along the direction Z. Further, as shown in FIG.

1C and FIG. 2, in the conductive pillar 130, each of the first conductive layer 132, the second conductive layer 134 and the third conductive layer 136 at the main body portion MP has the recess R on the illustrated top surface thereof. As such, from the cross-section view of FIG. 2, each of the first conductive layer 132, the second conductive layer 134 and the third conductive layer 136 at the main body portion MP has a U shape. From another point of view, the illustrated top surface of the main body portion MP is lower than the illustrated top surface of the peripheral portion PP.

In some embodiments, as shown in FIG. 1C and FIG. 2, each of the first conductive layer 142, the second conductive layer 144, the third conductive layer 146 and the fourth conductive layer 148 includes a flat and smooth top surface. That is to say, there is almost no obvious depression formed on the illustrated top surface of each of the first conductive layer 142, the second conductive layer 144, the third conductive layer 146 and the fourth conductive layer 148. However, the disclosure is not limited thereto. In some alternative embodiments, each of the first conductive layer 142, the second conductive layer 144, the third conductive layer 146 and the fourth conductive layer 148 may formed to have a recess on the top surface thereof, as long as the topography variation of the top surface of the conductive pillar 130 is greater than the topography variation of the top surface of the conductive pillar 140.

Figure 1D:
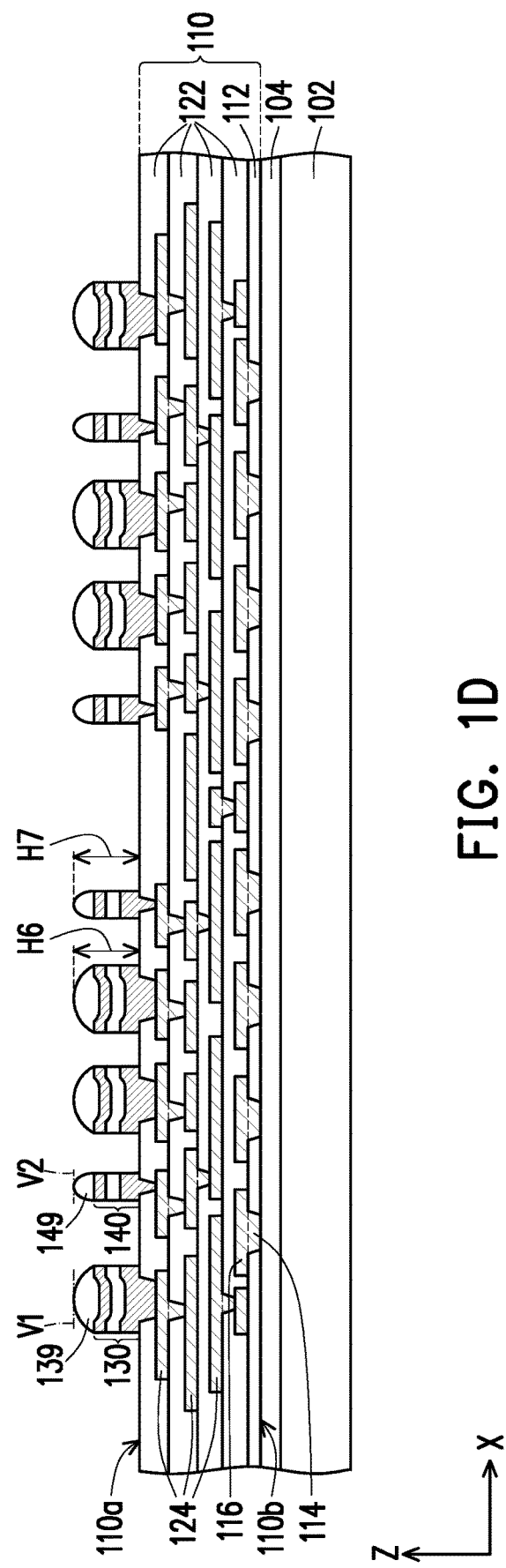

Referring to FIG. 1C and FIG. 1D, after forming the conductive pillars 130 and the conductive pillars 140 disposed on the first surface 110a of the redistribution structure 110, the patterned mask layer PR is removed to expose portions of the topmost layer of the dielectric layers 122 that are not covered by the conductive pillars 130 and the conductive pillars 140. In embodiments where the patterned mask layer PR is formed from the photoresist material, the patterned mask layer PR may be stripped by a chemical solution or another stripping process. Other suitable removal process (e.g., ashing, etching, a combination thereof, etc.) may be used to remove the patterned mask layer PR. In some embodiments, as shown in FIG. 1D, the conductive pillars 130 and the conductive pillars 140 have vertical side surfaces. However, the disclosure is not limited thereto. In some alternative embodiments, the conductive pillars 130 and the conductive pillars 140 may not have vertical side surfaces. For example, a reentrant profile with an undercut may be observed in a lower side surface of each of the conductive pillars 130 and the conductive pillars 140.

Continued on FIG. 1D, after removing the patterned mask layer PR, a reflow process is performed on the fourth conductive layers 138 and fourth conductive layers 148 to transform the fourth conductive layers 138 and fourth conductive layers 148 respectively into conductive caps 139 and conductive caps 149. Further, as shown in FIG. 1D, after forming the reflow process, a plurality of conductive bumps 150 and a plurality of conductive bumps 160 electrically connected with the redistribution structure 110 are formed on the first surface 110a of the redistribution structure 110. Each of the conductive bumps 150 includes the conductive pillar 130 and the conductive cap 139 over the conductive pillar 130, and each of the conductive bumps 160 includes the conductive pillar 140 and the conductive cap 149 over the conductive pillar 140. In detail, as shown in FIG. 1D, the conductive cap 139 covers the illustrated top surface of the conductive pillar 130 and fills up the recess R of conductive pillar 130 on the top surface thereof, and the conductive cap 149 covers the illustrated top surface of the conductive pillar 140. However, the disclosure is not limited thereto. In some alternative embodiments, the conductive cap 139 may further cover a portion of the side surface of the conductive pillar 130, and the conductive cap 149 may further cover a portion of the side surface of the conductive pillar 140. In some embodiments, the volume of the conductive cap 139 originated from the fourth conductive layer 138 is greater than the volume of the conductive cap 149 originated from the fourth conductive layer 148. The conductive bumps 150 and the conductive bumps 160 function to serve the purpose of electrical connection with the subsequently provided semiconductor devices (e.g., semiconductor devices 170 shown in FIG. 1E).

As illustrated in FIG. 1D, each of the conductive caps 139 and the conductive caps 149 after the reflow process exhibits a hemispherical shape. However, the disclosure is not limited thereto. In some alternative embodiments, the conductive caps 139 and the conductive caps 149 may take other forms after the reflow process. Further, as shown in FIG. 1D, a virtual plane V1 parallel with the direction X and where the vertex point of the conductive bump 150 is located on is at substantially the same level as a virtual plane V2 parallel with the direction X and where the vertex point of the conductive bump 160 is located on. Herein, when elements are described as "at substantially the same level", the elements are formed at substantially the same height. That is to say, the level height of the virtual plane V1 is substantially equal to the level height of the virtual plane V2. In other words, the height H6 of the conductive bump 150, measured from top surface (first surface 110a) of the redistribution structure 110 to the top of the conductive bump 150 along the direction Z, is substantially equal to the height H7 of the conductive bump 160, measured from top surface (first surface 110a) of the redistribution structure 110 to the top of the conductive bump 160 along the direction Z. However, the disclosure is not limited thereto. In some alternative embodiments, there is a slight height difference (to a neglectable degree during the subsequently bonding process) along the direction Z between the virtual plane V1 parallel with the direction X and where the vertex point of the conductive bump 150 is located on and the virtual plane V2 parallel with the direction X and where the vertex point of the conductive bump 160 is located on. That is to say, the level height of the virtual plane V1 is slightly different from the level height of the virtual plane V2. In other words, the height H6 of the conductive bump 150 is slightly different from the height H7 of the conductive bump 160. Apparently, by forming the conductive pillar 130 with the recess R formed on the top surface thereof to accommodate a portion of the conductive cap 139, even the volume of the conductive cap 139 is greater than the volume of the conductive cap 149, the surfaces of the conductive cap 139 and the conductive cap 149 may have improved coplanarity for bonding process.

Figure 1E:
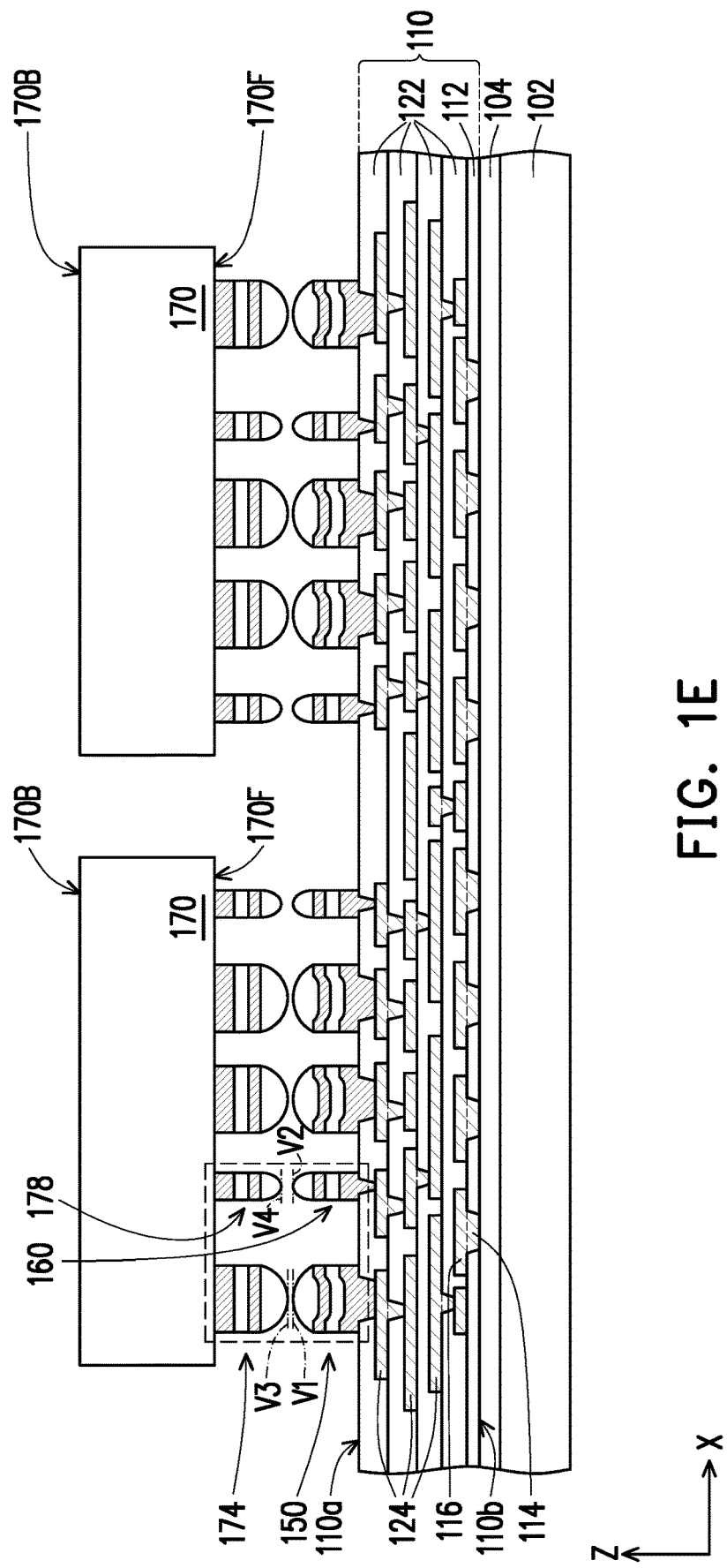

Referring to FIG. 1E, at least one semiconductor device 170 is provided over the first surface 110a of the redistribution structure 110. Although two semiconductor devices 170 are presented for illustrative purposes in FIG. 1E, those skilled in the art can understand that the number of the semiconductor devices 170 may be more than or less than what is depicted in FIG. 1E, and may be designated based on demand and/or design layout. The semiconductor devices 170 may each have a single function (e.g., a logic device, memory die, etc.), or may have multiple functions (e.g., a system on a chip (SoC), an application-specific integrated circuit (ASIC), etc.). In some embodiments, the semiconductor devices 170 have different functions and properties. It is appreciated that dies diced from different semiconductor wafers may have different properties and functions. Accordingly, in some embodiments that the semiconductor devices 170 have different functions, the semiconductor devices 170 are singulated from different semiconductor wafers. In some alternative embodiments, the semiconductor devices 170 have the same function and property, and are singulated from the same semiconductor wafer. That is to say, when the subsequently formed semiconductor package 100 includes multiple semiconductor devices 170, the multiple semiconductor devices 170 are different types of semiconductor devices or the same type of semiconductor device. In some embodiments, one of the semiconductor devices 170 is a SoC, and another of the semiconductor devices 170 is a memory device. The memory device may be a dynamic random access memory (DRAM) die, a static random access memory (SRAM) die, a hybrid memory cube (HMC) module, a high bandwidth memory (HBM) module, or the like. In an embodiment, one of the semiconductor devices 170 is a SoC, and another of the semiconductor devices 170 is a HBM module. Furthermore, in some embodiments, the semiconductor devices 170 may be in different sizes (e.g., different heights and/or surface areas). In some alternative embodiments, the semiconductor devices 170 may be in the same size (e.g., same heights and/or surface areas). That is to say, when the subsequently formed semiconductor package 100 includes multiple semiconductor devices 170, the multiple semiconductor devices 170 are in different sizes or t in the same size.

In some embodiments, as shown in FIG. 1E and FIG. 3, each of the semiconductor devices 170 has a front surface 170F (i.e., the illustrated bottom surface) and a back surface 170B (i.e., the illustrated top surface). In detail, as shown in FIG. 1E and FIG. 3, the front surface 170F faces the first surface 110a of the redistribution structure 110, and the back surface 170B opposite to the front surface 170F. In some embodiments, the front surface 170F is referred to as an active surface. In some embodiments, each of the semiconductor devices 170 includes a plurality of conductive bumps 174 and a plurality of conductive bumps 178 disposed at the front surface 170F. In detail, as shown in FIG. 1E and FIG. 3, each of the conductive bumps 174 includes a conductive pillar 172 and a conductive cap 173 over the conductive pillar 172, the conductive pillar 172 includes a first conductive layer 171a, a second conductive layer 171b and a third conductive layer 171c; and each of the conductive bumps 178 includes a conductive pillar 176 and a conductive cap 177 over the conductive pillar 176, the conductive pillar 176 includes a first conductive layer 175a, a second conductive layer 175b and a third conductive layer 175c. The fabrication process of the conductive bumps 174 and the conductive bumps 178 is similar to the fabrication process of the conductive bumps 150 and the conductive bumps 160 described with respect to FIG. 1B to FIG. 1D, and thus the detailed description thereof is omitted herein. And, the material of the first conductive layers 171a, 175a, the material of the second conductive layers 171b, 175b, and the material of the third conductive layers 171c, 175c are respectively similar to the material of the first conductive layers 132, 142, the material of the second conductive layers 134, 144, and the material of the third conductive layers 136, 146, so the detailed description thereof is omitted herein. Also, the material of the conductive caps 173, 177 is similar to the material of the conductive caps 139, 149, so the detailed description thereof is omitted herein.

In some embodiments, as shown in FIG. 1E and FIG. 3, the maximum dimension d10 of the conductive pillar 172 along the direction X is greater than the maximum dimension d11 of the conductive pillar 176 along the direction X. That is to say, the lateral size of the conductive pillar 172 is greater than the lateral size of the conductive pillar 176. In some embodiments, the maximum dimension d10 of the conductive pillar 172 ranges from about 50 μm to about 100 μm, and the maximum dimension d11 of the conductive pillar 176 ranges from about 15 μm to about 40 μm. In some embodiments, as shown in FIG. 1E and FIG. 3, the maximum dimension d10 of the conductive pillar 172 is the same as the maximum dimension d7 of the conductive pillar 130. However, the disclosure is not limited thereto. In some alternative embodiments, the maximum dimension d10 of the conductive pillar 172 may be different from the maximum dimension d7 of the conductive pillar 130. Similarly, the maximum dimension d11 of the conductive pillar 176 may be the same as or different from the maximum dimension d8 of the conductive pillar 140.

Continued on FIG. 1E, an aligning process is performed, such that the conductive bumps 174 and the conductive bumps 178 of each semiconductor device 170 respectively are substantially aligned to the conductive bumps 150 and the conductive bumps 160. In detail, as shown in FIG. 1E, each of the conductive bumps 174 is substantially aligned to one of the conductive bumps 150 in a one-to-one relationship, and each of the conductive bumps 178 is substantially aligned to one of the conductive bumps 160 in a one-to-one relationship. That is to say, the number of the conductive bumps 174 is corresponding to the number of the conductive bumps 150, and the number of the conductive bumps 178 is corresponding to the number of the conductive bumps 160.

Further, after the aligning process is performed, the semiconductor devices 170 are configured to be located at the positions ready for the subsequently bonding process. In detail, as shown in FIG. 1E, after performing the aligning process, a joint height gap g1 along the direction Z is formed between the virtual plane V1 parallel with the direction X and where the vertex point of the conductive bump 150 is located on is and the virtual plane V3 parallel with the direction X and where the vertex point of the conductive bump 174 is located on, and a joint height gap g2 along the direction Z is formed between the virtual plane V2 parallel with the direction X and where the vertex point of the conductive bump 160 is located on is and the virtual plane V4 parallel with the direction X and where the vertex point of the conductive bump 178 is located on. In some embodiments, there is a slight height difference (to a neglectable degree during the subsequently bonding process) between the joint height gap g1 to the joint height gap g2. Apparently, too large of the difference between the joint height gap g1 to the joint height gap g2 will cause joint risks (e.g., cold-joints and/or bridging) when mounting the semiconductor devices 170 onto the redistribution structure 110 through the subsequently bonding process. As such, it has been observed that by configuring the conductive bumps with different sizes (e.g., the conductive bumps 150 and the conductive bumps 160) to have the surfaces thereof with improved coplanarity, the joint height gap difference resulted from the different conductive bump size (e.g., the difference between the joint height gap g1 to the joint height gap g2) is advantageously controlled and reductions in manufacturing defects due to the bonding may be achieved.

Figure 1F:
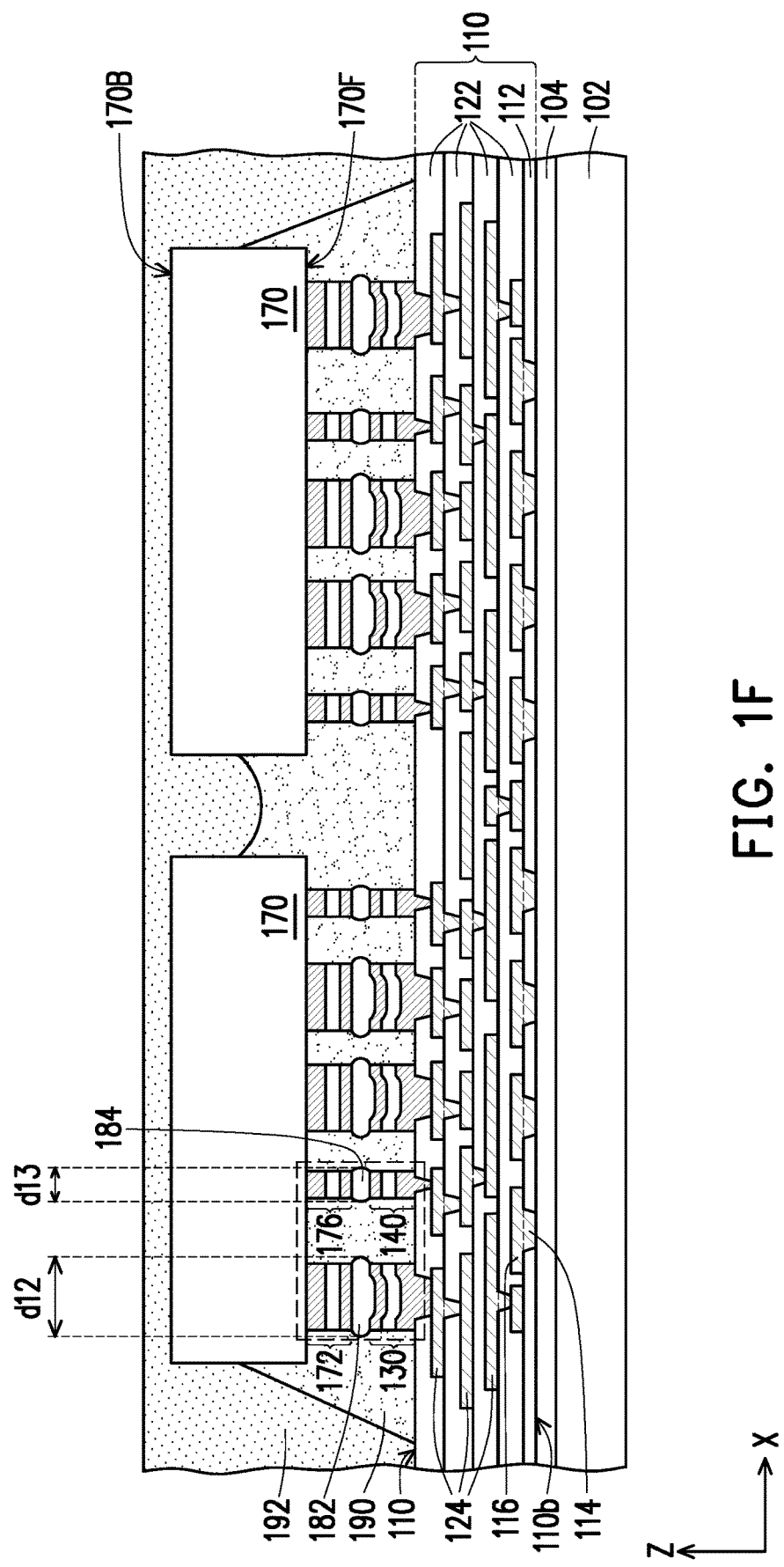

Referring to FIG. 1E, FIG. 3, FIG. 1F and FIG. 4, a bonding process is performed to mount the semiconductor devices 170 onto the redistribution structure 110. In detail, as shown in FIG. 1E, FIG. 3, FIG. 1F and FIG. 4, after the bonding process, the conductive cap 139 of each conductive bump 150 and the conductive cap 173 of each conductive bump 174 are combined together to form a joint structure 182, and the conductive cap 149 of each conductive bump 160 and the conductive cap 177 of each conductive bump 178 are combined together to form a joint structure 184. That is to say, the semiconductor devices 170 are electrically connected with the redistribution structure 110 through the conductive pillars 130, the conductive pillars 140, the joint structures 182, the joint structures 184, the conductive pillars 172, and the conductive pillars 176. In some embodiments, as shown in FIG. 1F, the joint structure 182 is located and bonded between the conductive pillar 130 and the conductive pillar 172, and the joint structure 184 is located and bonded between the conductive pillar 140 and the conductive pillar 177. However, the disclosure is not limited thereto. In some alternative embodiments, the joint structure 182 may further covers a portion of side surface of the conductive pillar 130 and a portion of side surface of the conductive pillar 172, and the joint structure 184 may further covers a portion of side surface of the conductive pillar 140 and a portion of side surface of the conductive pillar 174.

In some embodiments, the bonding process is a flip-chip bonding process. In some embodiments, the bonding process may include a reflow process. In some embodiments, during the bonding process, the reflow process is performed by heating the conductive caps 139 of the conductive bumps 150, the conductive caps 173 of the conductive bumps 174, the conductive caps 149 of the conductive bumps 160 and the conductive caps 177 of the conductive bumps 178 to a suitable temperature for melting. For example, during the reflow process, the temperature gradually increases until it reaches the melting temperature of the conductive caps 139, the conductive caps 173, the conductive caps 149 and the conductive caps 177. In embodiments where the conductive caps 139, the conductive caps 173, the conductive caps 149 and the conductive caps 177 are solder-containing layers, the conductive caps 139, the conductive caps 173, the conductive caps 149 and the conductive caps 177 may be heated to a temperature of or greater than a melting point of the conductive caps 139, the conductive caps 173, the conductive caps 149 and the conductive caps 177. For example, the temperature is elevated about 20° C. above the melting temperature of the conductive caps 139, the conductive caps 173, the conductive caps 149 and the conductive caps 177. It is noted that the reflowed temperature may vary depending on the composition content of the solder-containing layer. For example, when the conductive caps 139, the conductive caps 173, the conductive caps 149 and the conductive caps 177 include SAC solder, the conductive caps 139, the conductive caps 173, the conductive caps 149 and the conductive caps 177 may be heated to a higher temperature (e.g., greater than about 200° C.). In embodiments where the conductive caps 139, the conductive caps 173, the conductive caps 149 and the conductive caps 177 include SnBi solder, the conductive caps 139, the conductive caps 173, the conductive caps 149 and the conductive caps 177 may be heated to a lower temperature (e.g., greater than about 130° C.). After the reflow process, the temperature may gradually decrease, and the conductive caps 139 and the conductive caps 173 are combined together and allowed to cool off and solidify, the conductive caps 149 and the conductive caps 177 are combined together and allowed to cool off and solidify. In some embodiments, the joint structures 182, 184 may be referred to as solder joints.

The joint structures 182 may each be formed to have a maximum dimension d12 and a particular size ratio between the maximum dimension d12 and the maximum dimension d7 of the pillar portion P2, and the joint structures 184 may each be formed to have a maximum dimension d13 and a particular size ratio between the maximum dimension d13 and the maximum dimension d8 of the pillar portion P4, such that the reliable electrical contacts and improved electrical performance between the semiconductor devices 170 and the redistribution structure 110 may be achieved. As such, it has been observed that by optimizing the sizes of the via portions and the pillar portions in the conductive bumps with different sizes (e.g., the conductive bumps 150 and the conductive bumps 160) to render the different topography variations at the top surfaces thereof, the joint risks (e.g., cold-joints and bridging) of the joint structures (e.g., the joint structures 182 and the joint structures 184) are eliminated. In some embodiments, a ratio of the maximum dimension d12 of the joint structure 182 along the direction X to the maximum dimension d7 of the pillar portion P2 ranges from about 0.8 to 1.5, and a ratio of the maximum dimension d13 of the joint structure 184 along the direction X to the maximum dimension d8 of the pillar portion P4 ranges from about 0.8 to 1.5.

Referring to FIG. 1A to FIG. 1F, the redistribution structure 110 is formed prior to the placement of the semiconductor devices 170, and thus the foregoing process is considered as a "RDL first method." By adopting the RDL first method to form the redistribution structure 110 and the semiconductor devices 120 and 130 over the carrier 102, the subsequently formed semiconductor package 100 can be formed without being constrained by the fan-out ratio (i.e., the ratio of die area to package area). Moreover, since the semiconductor devices 170 are coupled to the first surface 110a of the redistribution structure 110 through flip-chip bonding, a die attach film (DAF) or a film on wire (FOW) utilized in conventional package structures for adhering the semiconductor devices is eliminated. As a result, an overall thickness of the subsequently formed semiconductor package 100 may be effectively reduced.

Continued on FIG. 1F, after the semiconductor devices 170 are connected with the redistribution structure 110, an underfill layer 190 is formed between the semiconductor devices 170 and the redistribution structure 110, surrounding the joint structures 182, 184. The underfill layer 190 may be formed by a capillary flow process after the semiconductor devices 170 are attached, or may be formed by a suitable deposition method before the semiconductor devices 170 are attached. In some embodiments, the underfill layer 190 includes polymer such as epoxy.

After forming the underfill layer 190, an encapsulant 192 is formed over the redistribution structure 110 to encapsulate the semiconductor devices 170 and the underfill layer 190. During this stage, the semiconductor devices 170 are fully encapsulated by the encapsulant 192, without exposing the back surfaces 170B of the semiconductor devices 170, as shown in FIG. 1F. That is to say, at this stage, the semiconductor devices 170 are not revealed and are well protected by the encapsulant 192. In some embodiments, the encapsulant 192 is a molding compound formed by an overmolding process. In some alternative embodiments, the material of the encapsulant 192 includes epoxy resins or other suitable resins.

Figure 1G:
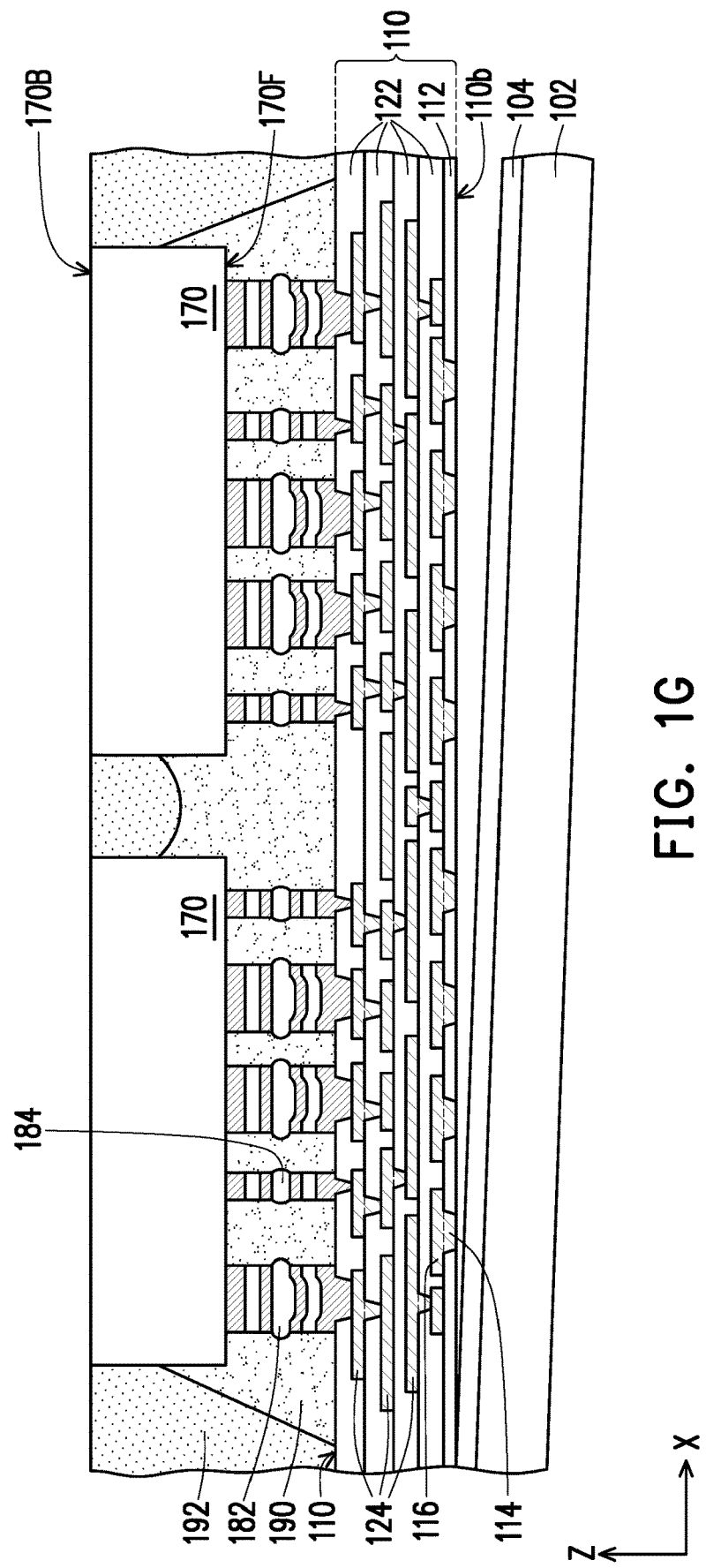

Referring to FIG. 1F and FIG. 1G, the encapsulant 192 is planarized until the back surface 170B of the semiconductor devices 170 are exposed. In some embodiments, as shown in FIG. 1G, after the planarization process, the illustrated top surface of the encapsulant 192 is substantially coplanar with the back surfaces 170B of the semiconductor devices 170. The encapsulant 192 may be planarized through a grinding process or a chemical mechanical polishing (CMP) process, for example. After the planarization or the grinding process, a cleaning step may be optionally performed to remove the residues generated. However, the disclosure is not limited thereto and the planarization process may be performed through any other suitable method.

After the encapsulant 192 is planarized to reveal the semiconductor devices 170, the redistribution structure 110 is separated from the carrier 102 such that the second surface 110b of the redistribution structure 110 is exposed. In detail, as shown in FIG. 1G, the conductive vias 114 for connecting with the later-formed electrical terminals 196 is exposed. In some embodiments, the de-bonding layer 104 is a LTHC release layer. Upon irradiation with an UV laser, the de-bonding layer 104 and the carrier 102 may be peeled off and removed from the overlying structure. It should be noted that the de-bonding process is not limited thereto. Other suitable methods may be used in some alternative embodiments. In some embodiments, before the carrier 102 is removed, a frame tape (not shown) is attached to the back surfaces 170B of the semiconductor devices 170.

Figure 1H:
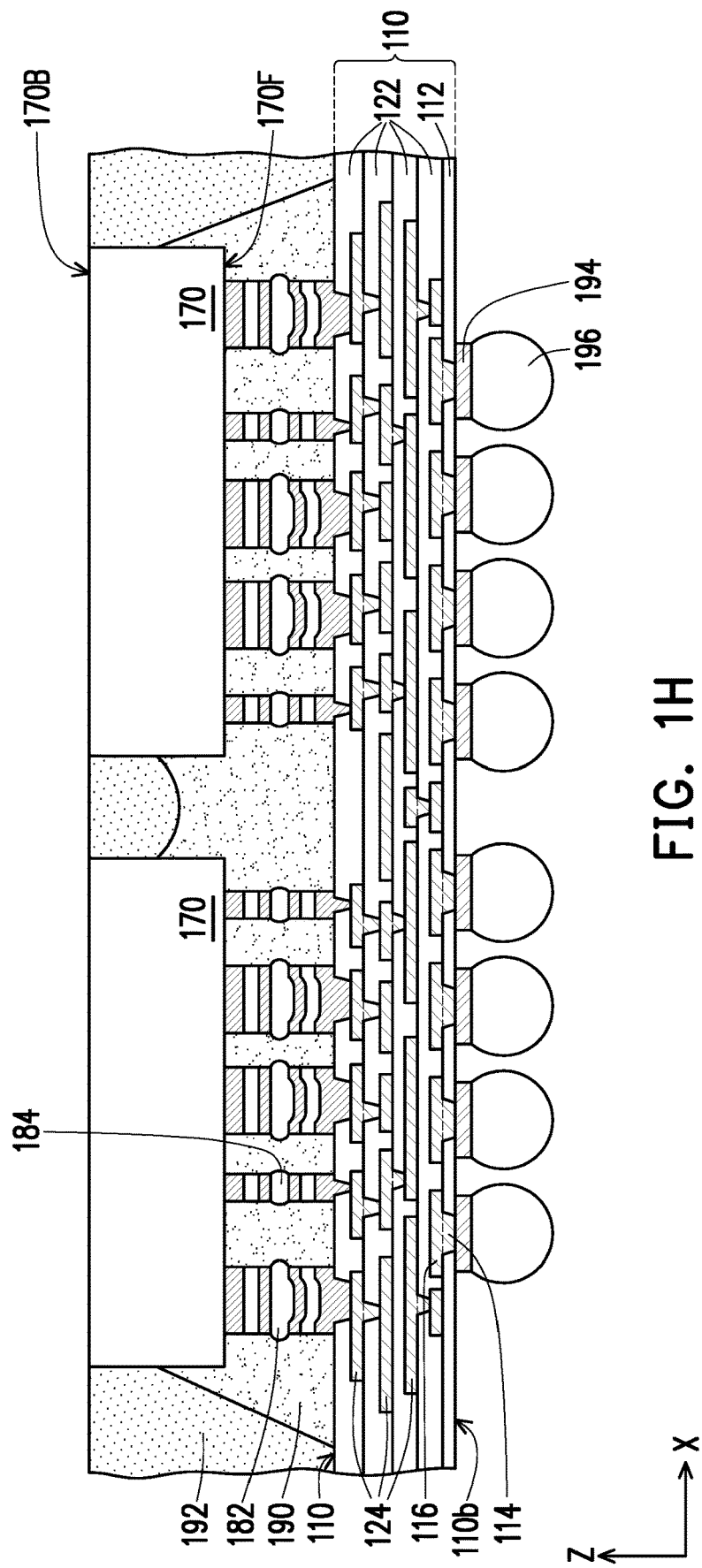

Referring to FIG. 1H, a plurality of under-ball metallurgy (UBM) patterns 194 and a plurality of conductive terminals 196 are sequentially formed on and electrically connected with the exposed conductive vias 114. The UBM patterns 194 may be formed for ball mount. In some embodiments, the material of the UBM patterns 194 includes aluminum, copper, nickel, or an alloy thereof. After the UBM patterns 194 are formed, the conductive terminals 196 are placed on the UBM patterns 194. In some embodiments, the conductive terminals 196 are controlled collapse chip connection (C4) bumps. The conductive terminals 196 may include a conductive material such as solder, copper, aluminum, gold, nickel, silver, palladium, tin, the like, or combinations thereof. In some embodiments, the electrical terminals 196 are formed by initially forming a layer of solder through evaporation, electroplating, printing, solder transfer, ball placement, or the like. Once the layer of solder has been formed on the structure, a reflow process may be performed in order to shape the material into the desired bump shapes. In another embodiment, the electrical terminals 196 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, after the UBM patterns 194 and the electrical terminals 196 are formed, the frame tape (not shown) remains attached on the back surfaces 170B of the semiconductor devices 170. However, the disclosure is not limited thereto. In some alternative embodiments, after the UBM patterns 194 and the electrical terminals 196 are formed, the frame tape (not shown) is separated from the semiconductor devices 170.

Figure 1I:
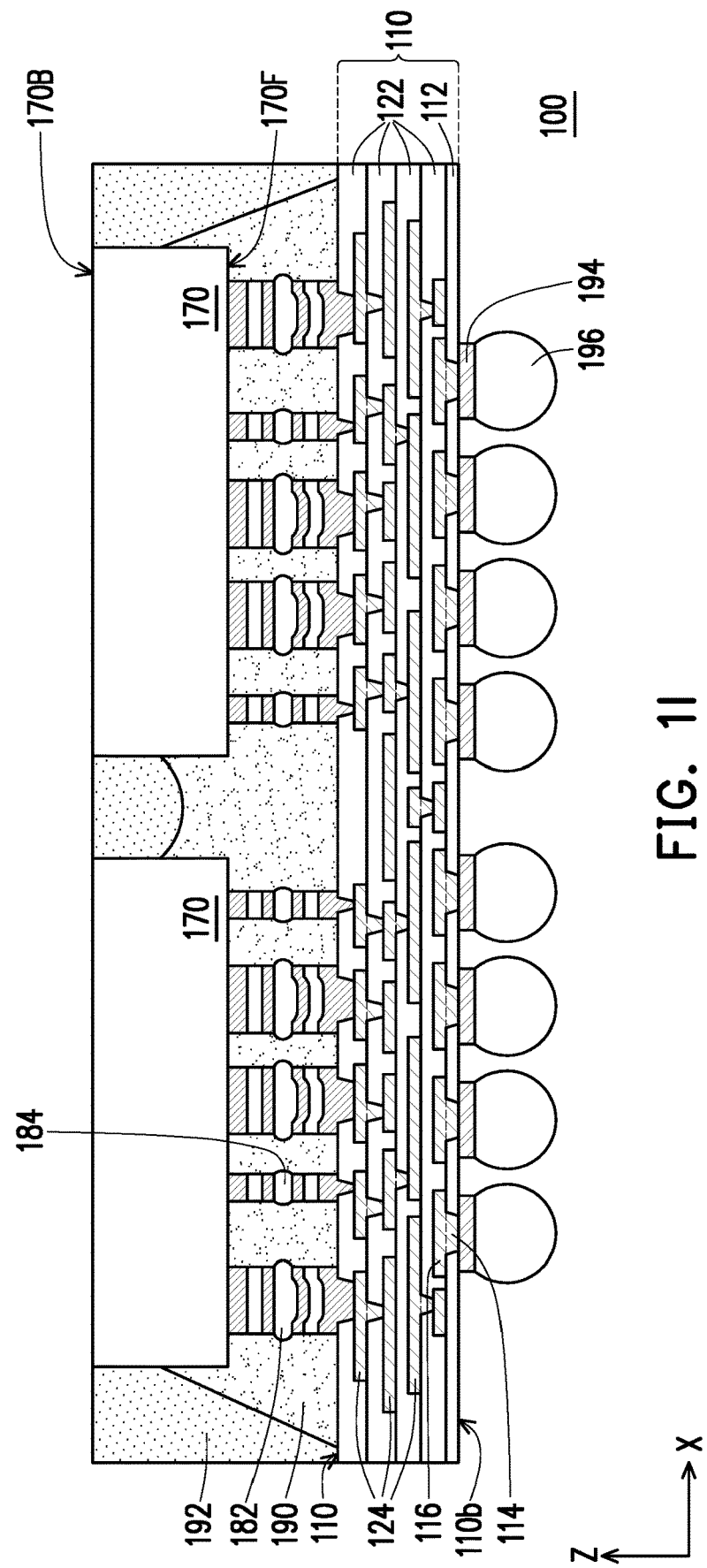

Referring to FIG. 1I, after the formation of the UBM patterns 194 and the electrical terminals 196, a singulation process is performed along scribe line regions between the adjacent package regions to cut the whole structure shown in FIG. 1H into a plurality of semiconductor packages 100. As mentioned, the manufacturing process described above is part of a wafer level packaging process, although one singulated semiconductor package 100 is shown in FIG. 1I, those skilled in the art should understand that plural semiconductor packages 100 are obtained after the singulation process. In some embodiments, the singulation process is performed to cut through redistribution structure 110 and the encapsulant 192, as shown in FIG. 1H and FIG. 1I. The singulation process may be a blade cutting process or a laser cutting process. In some embodiments, the frame tape (not shown) remains attached on the back surfaces 170B of the semiconductor devices 170 is removed after the singulation process. In a subsequent process, the singulated semiconductor package 100 may, for example, be disposed onto a circuit substrate or onto other components based on requirements.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 5:
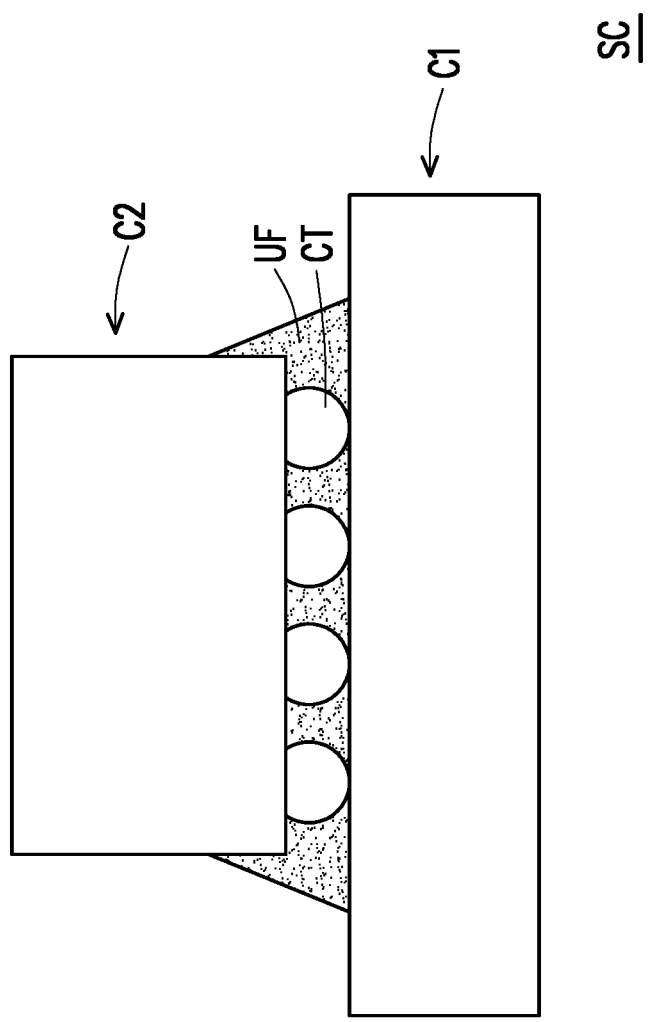
FIG. 5 is a schematic cross-sectional view showing an application of a semiconductor structure in accordance with some embodiments of the disclosure.

FIG. 5 is a schematic cross-sectional view showing an application of a semiconductor structure in accordance with some embodiments of the disclosure. Referring to FIG. 5, a component assembly SC including a first component C1 and a second component C2 disposed over the first component C1 is provided. The first component C1 may be or may include a package substrate, a printed circuit board (PCB), a printed wiring board, and/or other carrier that is capable of carrying integrated circuits. In some embodiments, the second component C2 mounted on the first component C1 is similar to the semiconductor package 100 described above. For example, the semiconductor package 100 may be electrically coupled to the first component C1 through a plurality of terminals CT. The terminals CT may be the electrical terminals 196 described above. In some embodiments, an underfill layer UF is formed between the space of the first component C1 and the second component C2 to at least laterally cover the terminals CT. Alternatively, the underfill layer UF is omitted.

Other packaging techniques may be used to form the component assembly SC, which are not limited in the disclosure. For example, the component assembly SC is formed using a wafer level packaging (WLP), a chip-on-wafer-on-substrate (CoWoS) process, a chip-on-chip-on-substrate (CoCoS) process, etc. The component assembly SC may be a part of an electronic system for such as computers (e.g., high-performance computer), computational devices used in conjunction with an artificial intelligence system, wireless communication devices, computer-related peripherals, entertainment devices, etc. The component assembly SC including the semiconductor structure(s) discussed herein may provide high bandwidth data communication. It should be noted that other electronic applications are also possible.

In accordance with an embodiment, a semiconductor package includes a redistribution structure, a first conductive pillar, a second conductive pillar and a semiconductor device. The redistribution structure has a first surface and a second surface opposite to the first surface. The first conductive pillar and the second conductive pillar are disposed on the first surface of the redistribution structure and electrically connected with the redistribution structure, wherein a maximum lateral dimension of the first conductive pillar is greater than a maximum lateral dimension of the second conductive pillar, and a topography variation of a top surface of the first conductive pillar is greater than a topography variation of a top surface of the second conductive pillar. The semiconductor device is disposed over the first surface of the redistribution structure, wherein the semiconductor device comprises a third conductive pillar and a fourth conductive pillar, the third conductive pillar is bonded to first conductive pillar through a first joint structure, and the fourth conductive pillar is bonded to second conductive pillar through a second joint structure.

In accordance with an embodiment, a semiconductor package includes a semiconductor device, a redistribution structure, a third conductive pillar, a fourth conductive pillar, a first joint structure and a second joint structure. The semiconductor device includes a first conductive pillar and a second conductive pillar. The redistribution structure is disposed below the semiconductor device and includes dielectric layers sequentially stacked along a first direction. The third conductive pillar and the fourth conductive pillar are disposed on the dielectric layer closest to the semiconductor device and electrically connected with the redistribution structure, wherein each of the third conductive pillar and the fourth conductive pillar comprises a via portion penetrating through the dielectric layer closest to the semiconductor device and a pillar portion over the via portion, a maximum dimension of the via portion of the third conductive pillar along a second direction is greater than a maximum dimension of the via portion of the fourth conductive pillar along the second direction, a maximum dimension of the pillar portion of the third conductive pillar along the second direction is greater than a maximum dimension of the pillar portion of the fourth conductive pillar along the second direction, and the second direction is perpendicular to the first direction. The first joint structure and the second joint structure are disposed between the semiconductor device and the redistribution structure, wherein the first joint structure is connected between the first conductive pillar and the third conductive pillar, and the second joint structure is connected between the second conductive pillar and the fourth conductive pillar.

In accordance with an embodiment, a method of forming a semiconductor package includes at least the following steps. A redistribution structure is formed. A first conductive bump and a second conductive bump are formed on the redistribution structure and electrically connected with the redistribution structure, wherein each of the first conductive bump and the second conductive bump comprises a conductive pillar and a conductive cap on the conductive pillar, a maximum lateral dimension of the conductive pillar of the first conductive bump is greater than a maximum lateral dimension of the conductive pillar of the second conductive bump, the conductive pillar of the first conductive bump comprises a main body portion and a peripheral portion wrapping the main body portion, the main body portion has a recess, and the conductive cap of the first conductive bump fills in the recess. A semiconductor device is provided with a third conductive bump and a fourth conductive bump, wherein each of the third conductive bump and the fourth conductive bump comprises the conductive pillar and the conductive cap. The first conductive bump is aligned with the third conductive bump and the second conductive bump is aligned with the fourth conductive bump. The conductive cap of the first conductive bump is combined with the conductive cap of the third conductive bump to form a first joint structure and the conductive cap of the second conductive bump is combined with the conductive cap of the fourth conductive bump to form a second joint structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
    a redistribution structure having a first surface and a second surface opposite to the first surface;
    a first conductive pillar and a second conductive pillar disposed on the first surface of the redistribution structure and electrically connected with the redistribution structure, wherein a maximum lateral dimension of the first conductive pillar is greater than a maximum lateral dimension of the second conductive pillar, and a topography variation of a top surface of the first conductive pillar is greater than a topography variation of a top surface of the second conductive pillar, wherein the first conductive pillar comprises a main body portion having a recess on a top surface thereof, a maximum depth of the recess ranges from greater than 0 μm to less than or equal to about 10 μm, and a maximum lateral dimension of the recess ranges from about 10 μm to about 85 μm; and
    a semiconductor device disposed over the first surface of the redistribution structure, wherein the semiconductor device comprises a third conductive pillar and a fourth conductive pillar, the third conductive pillar is bonded to first conductive pillar through a first joint structure, and the fourth conductive pillar is bonded to second conductive pillar through a second joint structure.

2. The semiconductor package according to claim 1, wherein the first conductive pillar further comprises a peripheral portion wrapping the main body portion, and the top surface of the second conductive pillar is a flat surface.

3. The semiconductor package according to claim 2, wherein a ratio of a maximum lateral dimension of the main body portion to the maximum lateral dimension of the first conductive pillar ranges from 0.4 to 0.95.

4. The semiconductor package according to claim 2, wherein the main body portion comprises a first portion embedded in the redistribution structure and a second portion over the first portion, the second conductive pillar comprises a third portion embedded in the redistribution structure and a forth portion over the third portion, and a maximum lateral dimension of the first portion is greater than a maximum lateral dimension of the third portion.

5. The semiconductor package according to claim 1, wherein a ratio of a maximum lateral dimension of the first joint structure to the maximum lateral dimension of the first conductive pillar ranges from 0.8 to 1.5, and a ratio of a maximum lateral dimension of the second joint structure to the maximum lateral dimension of the second conductive pillar ranges from 0.8 to 1.5.

6. The semiconductor package according to claim 1, further comprising:
    an underfill layer between the semiconductor device and the redistribution structure; and
    an encapsulant encapsulating the semiconductor device and the underfill layer.

7. The semiconductor package according to claim 1, further comprising:
    conductive terminals disposed over the second surface of the redistribution structure and electrically connected with the redistribution structure.

8. A semiconductor package, comprising:
    a semiconductor device comprising a first conductive pillar and a second conductive pillar;

a redistribution structure disposed below the semiconductor device and comprising dielectric layers sequentially stacked along a first direction;

a third conductive pillar and a fourth conductive pillar disposed on the dielectric layer closest to the semiconductor device and electrically connected with the redistribution structure, wherein each of the third conductive pillar and the fourth conductive pillar comprises a via portion penetrating through the dielectric layer closest to the semiconductor device and a pillar portion over the via portion, a maximum dimension of the via portion of the third conductive pillar along a second direction is greater than a maximum dimension of the via portion of the fourth conductive pillar along the second direction, a maximum dimension of the pillar portion of the third conductive pillar along the second direction is greater than a maximum dimension of the pillar portion of the fourth conductive pillar along the second direction, and the second direction is perpendicular to the first direction, and wherein a top surface of the pillar portion of the third conductive pillar comprises a recess having a vertical projection along the first direction falling within a span of the via portion of the third conductive pillar, and a maximum depth of the recess is less than or equal to a height of the via portion of the third conductive pillar; and a first joint structure and a second joint structure disposed between the semiconductor device and the redistribution structure, wherein the first joint structure is connected between the first conductive pillar and the third conductive pillar, and the second joint structure is connected between the second conductive pillar and the fourth conductive pillar.

9. The semiconductor package according to claim 8, wherein a ratio of the maximum dimension of the via portion of the third conductive pillar along the second direction to the maximum dimension of the pillar portion of the third conductive pillar along the second direction ranges from 0.4 to 0.95.

10. The semiconductor package according to claim 8, wherein a ratio of a maximum dimension of the first joint structure along the second direction to the maximum dimension of the pillar portion of the third conductive pillar along the second direction ranges from 0.8 to 1.5, and a ratio of a maximum dimension of the second joint structure along the second direction to the maximum dimension of the pillar portion of the fourth conductive pillar along the second direction ranges from 0.8 to 1.5.

11. The semiconductor package according to claim 8, wherein the redistribution structure further comprises conductive layers, the conductive layers and the dielectric layers are stacked alternately along the first direction, and the third conductive pillar and the fourth conductive pillar are in contact with the conductive layer closest to the semiconductor device.

12. The semiconductor package according to claim 8, wherein each of the first conductive pillar, the second conductive pillar, the third conductive pillar, and the fourth conductive pillar comprises:
   a first copper-containing layer;
   a nickel-containing layer overlying the first copper-containing; and
   a second copper-containing layer overlying the nickel-containing layer.

13. The semiconductor package according to claim 12, wherein the via portion is formed by a portion of the first copper-containing layer, and the pillar portion is formed by the nickel-containing layer, the second copper-containing layer and another portion of the first copper-containing layer.

14. The semiconductor package according to claim 8, further comprising:
   an underfill layer between the semiconductor device and the redistribution structure, and surrounding the first joint structure and the second joint structure;
   an encapsulant encapsulating the semiconductor device and the underfill layer; and
   conductive terminals disposed over the dielectric layer farthest away from the semiconductor device and electrically connected with the redistribution structure.

15. The semiconductor package according to claim 8, wherein the maximum depth of the recess ranges from greater than 0 µm to less than or equal to 10 µm.

16. The semiconductor package according to claim 8, wherein a top surface of the pillar portion of the fourth conductive pillar is a flat surface.

* * * * *